United States Patent [19]
Tomoda

[11] Patent Number: 5,946,476
[45] Date of Patent: *Aug. 31, 1999

[54] METHOD AND APPARATUS FOR DESIGNING THE LAYOUT OF CIRCUIT COMPONENT PATTERNS

[75] Inventor: Junji Tomoda, Kasugai, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/488,867

[22] Filed: Jun. 9, 1995

[30] Foreign Application Priority Data

Jun. 14, 1994 [JP] Japan .................................... 6-132230

[51] Int. Cl.$^6$ ............................. G06F 17/00; G06F 17/50
[52] U.S. Cl. ......................................................... 395/500.1
[58] Field of Search ..................................... 364/488–491, 364/578, 468.01, 468.09; 395/500, 10, 134; 437/195; 345/418, 342, 964

[56] References Cited

U.S. PATENT DOCUMENTS

| | | | |
|---|---|---|---|
| 4,779,210 | 10/1988 | Katsura et al. ........................... | 395/134 |
| 4,812,962 | 3/1989 | Witt ......................................... | 364/490 |
| 5,410,634 | 4/1995 | Li ............................................. | 395/10 |
| 5,442,714 | 8/1995 | Iguchi ..................................... | 382/144 |
| 5,546,225 | 8/1996 | Shiraishi ................................. | 359/559 |
| 5,551,014 | 8/1996 | Yoshida et al. ........................ | 395/500 |
| 5,556,805 | 9/1996 | Tanizawa et al. ...................... | 437/195 |

OTHER PUBLICATIONS

Suzuki "A Practical Online Design Rule Checking System," IEEE, 1990, p. 246–252.

*Primary Examiner*—Kevin J. Teska
*Assistant Examiner*—Vuthe Siek
*Attorney, Agent, or Firm*—Armstrong, Westerman, Hattori, Mcleland, & Naughton

[57] ABSTRACT

The method and apparatus is disclosed, for designing the layout of circuit component patterns on a semiconductor integrated circuit. A CAD system includes an input file for storing circuit pattern design data descriptive of the layout of component patterns formed on the semiconductor integrated circuit, and a processing unit coupled to the input file and supplied with circuit pattern control data and window designation data, the circuit pattern control data being descriptive of design requirements of the component patterns. The processing unit inputs the circuit pattern design data from said input file; defines a window over component patterns of the integrated circuit based on the window designation data, thereby identifying data of circuit component patterns that are wholly or partially within the window; generates window pattern data descriptive of the details of the window pattern by using the window designation data; subjects the identified circuit component pattern data to a process according to the design requirement of the circuit pattern control data; and selectively identifies the processed pattern data by referring to the window pattern data to distinguish data relevant to a designer from data irrelevant to the designer.

20 Claims, 24 Drawing Sheets

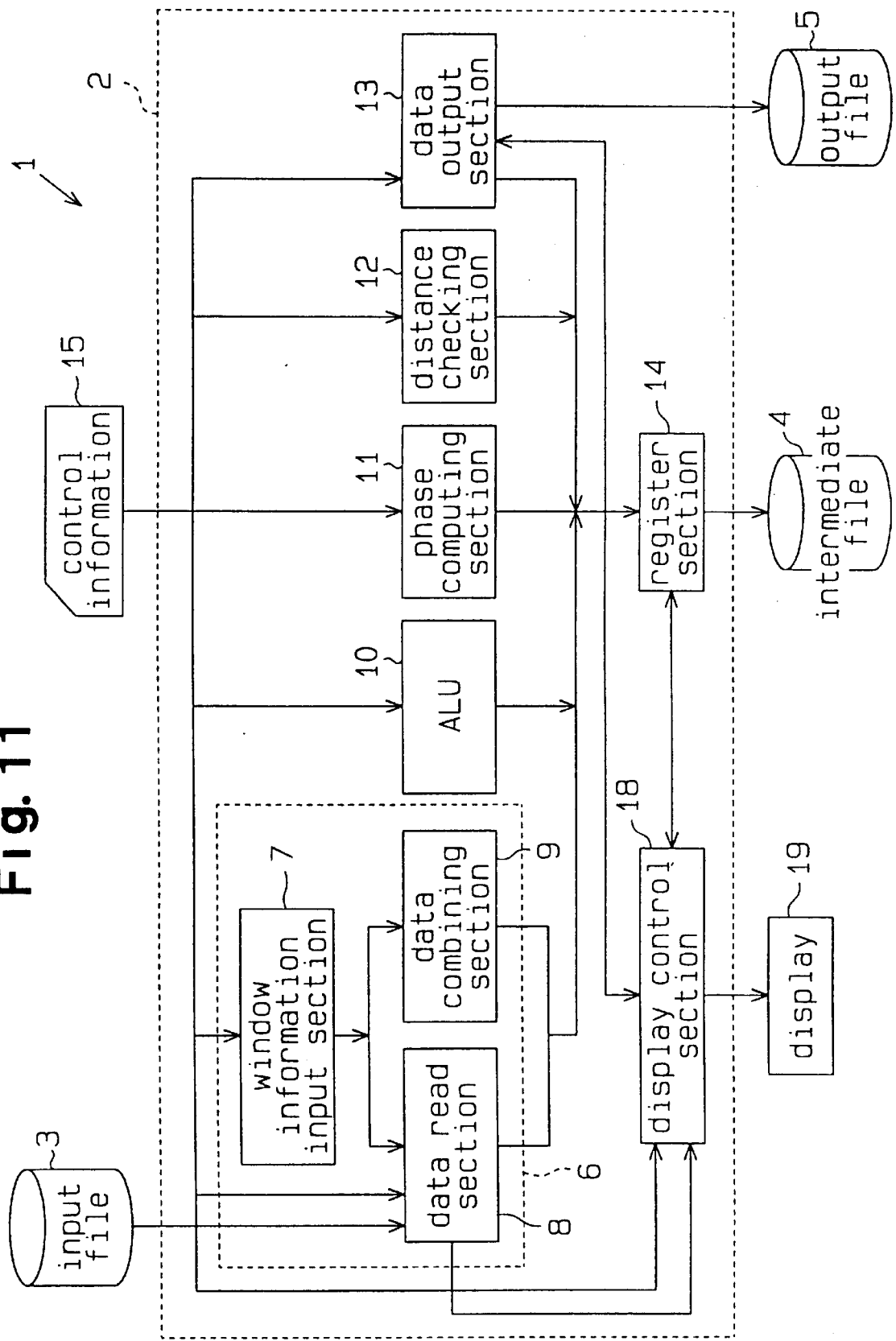

METHOD AND APPARATUS FOR DESIGNING THE LAYOUT OF CIRCUIT COMPONENT PATTERNS

BACKGROUND OF THE INVENTION

1. Field of the Invention

The present invention relates generally to a system of processing graphic or pattern data using a computer. More particularly, this invention relates to a system of processing circuit component pattern data according to the design requirement of a semiconductor integrated circuit design.

2. Description of the Related Art

One way to manage the vast amount of data necessary for computer aided design (CAD) of semiconductor circuit is to separate the data into reasonable sized data segments for separate data processing. Data management of this type not only increases data processing efficiency, but also decreases overall semiconductor design time and design costs. Segmented data processing, when designing complex circuit, further allows for enhanced manipulation of the many and various types of data. Moreover, computer aided circuit design often requires selection of individual circuit component patterns. Utilizing segmented data processing further increases the ability of the circuit designer to select individual circuit patterns for further data processing.

Most CAD systems today are capable of selecting individual circuit component patterns or groups of patterns to facilitate the design process. This function is in particular helpful to check whether one or more design patterns meet design requirements, as is done with the so-called design rule check (DRC). To perform this type of error checking, the circuit designer selects a portion of the layout design using a technique called windowing. Windowing is typically performed by the circuit designer manipulating a mouse or other computer input device to select a portion of the layout design displayed on a computer monitor or other device. With one portion of the design layout selected or windowed, the CAD program can then perform data processing on that portion of the design wholly or partially within the selected window. The type of data generally used for this includes circuit component and layout data, substrate layer data and window coordinate data. Rectangular pattern of a design layout can be defined by the coordinate values of the individual vertexes of the rectangular pattern.

FIG. 1 shows the layout of circuit components of a semiconductor chip 186 used for a semiconductor device 185. The semiconductor chip 186 has a plurality of functional circuit blocks B1 to B5 arranged at the center, and a number of pads 187 surrounding the circuit blocks B1–B5. Each of the circuit blocks B1–B5 has circuit component patterns laid out for that block. The individual circuit blocks B1–B5 when connected by interconnection patterns form the semiconductor device 185.

A layout check for the semiconductor chip 186 is performed to check the integrity of the interconnection patterns and to check the component patterns forming the circuitry in each of the blocks B1–B5. Typically, the circuit designer designates a portion of the circuit design for the system to check. By specifying two points on the design, the CAD system can generate a rectangular window based on an orthogonal line connecting the two points. For example, as shown in FIG. 1, once points P1 and P2 are selected, the CAD system generates a window 188. In similar fashion, points P3 and P4 demarcate a window 189, points P5 and P6 demarcate a window 190, and points P7 and P8 demarcate a window 191. Next, the CAD system identifies the pattern data design contained either entirely or partially in each of the windows 188 to 191, and executes a desired process on the identified pattern data. Window designation allows the CAD system to limit the amount of data processing to only those patterns in need of processing. Designating multiple windows for larger circuit designs permits the CAD system to perform pattern data processing one window at a time. Segmented data processing like this allows the CAD system to store the results of the processing on each data segment, conserves computer resources, and increases data processing speed.

The above described pattern of data processing, however, experiences problems when portions of the pattern data, identified as being within the window, are located near the boundary of the window. Suppose, as shown in FIG. 2, a pattern 193 and a pattern 194 overlap each other in order to form a single combined pattern only a part of the pattern 193 is included in the window 192. Therefore, the CAD system will identify the pattern 193 rather than the combined pattern (193, 194) for pattern data processing. This misidentification causes erroneous data processing.

An additional problem for CAD processing based on conventional windowing techniques relates to the accuracy of the distance detected between patterns in the layout of semiconductor designs. This will be explained with reference to FIGS. 3 through 7.

In step 160 in the flowchart in FIG. 3, the CAD system initially processes prepared input data descriptive of a circuit component pattern and stores the input data in a file. FIG. 4A, for example, illustrates a pattern group 170 consisting of nine patterns 171 to 179. The same pattern group is shown in FIG. 4B having a windowed shade area 180 superimposed on a portion of the pattern group 170. Coordinates P20 and P21 of the window 180 can be preset by the circuit designer or selected by means of an input device such as a mouse or keyboard (not shown). Following the designation of the window 180, the CAD system identifies data descriptive of the patterns 174, 176, 178 and 179 positioned entirely or partially in the window 180, as shown in FIG. 4C. Data descriptive of patterns wholly outside the window is not processed. The CAD system next stores the windowed data in an associated file, and releases the designation of the window 180.

In step 161, the CAD system detects and eliminates overlapping portions of the patterns identified in step 160. Pattern overlap is typical of semiconductors formed with superimposed layers of patterns, each having their own individual pattern data. Thus, as shown in FIG. 5A, the patterns 178 and 179 are two patterns among the windowed pattern data 174, 176, 178 and 179 that overlap each other. By executing a logical OR operation relative to the patterns 178 and 179, the CAD system eliminates the overlap pattern from the two patterns and creates a single pattern 182, as shown in FIG. 5B. The CAD system then stores the data of the patterns 174, 176 and 182 in a system file.

In step 162, the CAD system checks the distance between the individual patterns against system design specifications. In particular, the CAD system reads the data describing patterns 174, 176 and 182 from the system file, identifies the distances between the patterns as shown in FIG. 6A and compares the distances against the design specifications. When the distance D1 or D2, as shown in FIG. 6A, is determined to be smaller than required by the design specifications, the CAD system considers the design layout flawed. Upon this occurrence, the CAD system generates a layout error indication pattern between the patterns not meeting design specifications. In the example shown in FIG. 6C, layout error indication patterns 183 and 184 are generated between patterns 174, 176 and 174, 182, respectively. The CAD system then stores the data describing the patterns 174, 176 and 182 as well as data describing layout error indication patterns 183 and 184 in a single system file.

The CAD system then, at step 163, integrates data describing the layout error indication patterns 183 and 184 with data describing the patterns 171 to 179 to produce data descriptive of a processed pattern group. This data may then be displayed on a display screen or the like for the benefit of the circuit designer.

Even when the patterns 174, 175 and 176 as shown in FIG. 7 should be handled as a single combined pattern, however, conventional CAD systems generate an error indication pattern 183 between the patterns 174 and 176. Since the error indication pattern 183 is wholly included in the pattern 175, the pattern 183 is not necessary. This unfortunately forces the circuit designer to check whether each of the generated error indication patterns is proper or necessary, referring to the error indication patterns 183 and 184 on the display screen. This is caused by the pattern 175 being between the patterns 174 and 176 but outside of the designated window 180. Conventional CAD systems are not designed to automatically remove unnecessary error indication patterns from the pattern group or to identify necessary error indication patterns. This often forces the circuit designer to check all the error indication patterns on the display, reducing the efficiency of the circuit design process.

To date, conventional CAD systems have had great difficulty in processing pattern data organized according to some data management systems. Examples of how data is organized according to three well known types of management systems are shown in FIGS. 8A, 9A and 10A. FIG. 8A illustrates a first arrangement of data in which circuit component pattern data is hierarchically arranged. FIG. 9A illustrates a second system in which circuit component pattern data is segmented. FIG. 10A illustrates a third system in which circuit component pattern data is arranged at random.

The data group shown in FIG. 8A includes upper rank pattern data H1 and first and second lower rank pattern data H2 and H3. If a CAD system identifies the data H3 by window designation, the CAD system then processes data H3 to generate new pattern data H4. It then replaces the old data H3 with the new data H4, as shown in FIG. 8B. Usually, this data replacement is trouble free, since each of the data H1, H2 and H3 is separated or independent from each other. Accordingly, pattern data arranged as shown in FIGS. 8A and 8B is easily enough processed by conventional CAD systems.

The data group shown in FIG. 9A includes a plurality of data of segmented patterns R1 to R4. These patterns are obtained by dividing a single circuit design layout into four areas. The data group further includes information managing data for managing the four segmented pattern data. If a CAD system identifies the fourth segmented pattern data R4 by window designation, the CAD system then processes data R4 to generate new pattern data R5. Next, the CAD system replaces the old data R4 with the new data R5, as shown in FIGS. 9A and 9B. As before, this data replacement is usually performed without trouble, since each of the data R1 to R4 is separated or independent from one the other. Accordingly, pattern data managed in the manner shown in FIGS. 9A and 9B can be easily processed by conventional CAD systems.

Pattern data arrangement, as shown in FIG. 10A, however, presents a problem for conventional CAD systems.

The data group S1 shown in FIG. 10A includes individual circuit component pattern data arranged at random. If a CAD system identifies pattern data Sx by window designation, as shown in FIG. 10B, the CAD system then processes the data Sx to generate new pattern data S2. Although the designated pattern data Sx is generally defined by using coordinate values with respect to an origin set on reference pattern other than the pattern Sx, the newly generated pattern data S2 will be defined by new coordinate values with respect to an origin set on the new pattern S2. For this reason, it is impossible, or at least improper to directly replace the old pattern data Sx with the new pattern data S2. This forces the circuit designer to input data necessary to return the new data S2 to the original data group S1. In this type of manual control, the designated pattern data Sx is removed from the data group S1, and the new pattern data S2 is incorporated into the data group S1 to match the remaining data in the data group S1. Should the CAD system have a reverse window function, to automatically perform an operation corresponding to the manual control, the circuit designer still has to recall which window was previously designated for the pattern data Sx. Thus, even with a reverse window function, data organized at random still presents CAD system operations with an inconvenient not present with other forms of data management.

SUMMARY OF THE INVENTION

Accordingly, it is a primary objective of the present invention to provide reliable and efficient method of processing circuit component pattern data irrespective of the arrangement of data in the group pattern.

To achieve the foregoing and other objects and in accordance with the purpose of the present invention, an improved computer based method is provided to design the layout of circuit component patterns on a semiconductor integrated circuit. The method according to the present invention includes the steps of:

(a) inputting circuit pattern design data, circuit pattern control data and window designation data to a computer, the pattern design data being descriptive of the layout of component patterns formed on the semiconductor integrated circuit, the circuit pattern control data being descriptive of design requirements of the component patterns formed on the semiconductor integrated circuit;

(b) defining a window over component patterns of the integrated circuit based on the window designation data, thereby identifying data of circuit component patterns that are wholly or partially within the window;

(c) generating window pattern data descriptive of the details of the window pattern by using the window designation data;

(d) subjecting the identified circuit component pattern data to a process according to the design requirement of the circuit pattern control data; and (e) selectively identifying the processed pattern data by referring to the window pattern data to distinguish data relevant to a designer from data irrelevant to the designer.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 11 through 20 illustrate a first embodiment according to the present invention:

FIG. 11 is a block diagram showing a circuit component pattern data processor;

FIG. 12 is a flowchart illustrating the procedure for processing pattern data;

FIG. 20 is a diagram showing component patterns including the obtained error indication pattern.

FIGS. 21 through 34 illustrate a second embodiment according to the present invention:

FIG. 21 is a block diagram showing a circuit component pattern data processor;

FIG. 24 is a flowchart illustrating the procedure for processing pattern data;

FIG. 34 is a diagram showing component patterns including the redesigned pattern.

DETAILED DESCRIPTION OF THE PREFERRED EMBODIMENTS

First Embodiment

Figure 1:
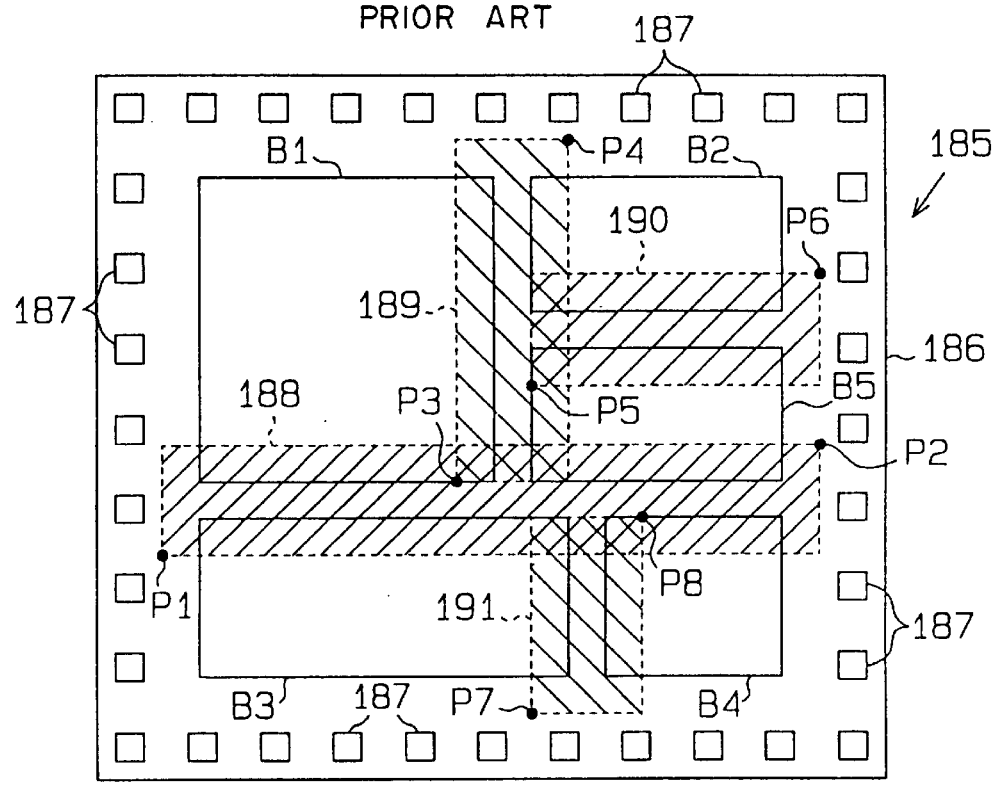
FIG. 1 is a layout diagram of a semiconductor chip.
Figure 2:
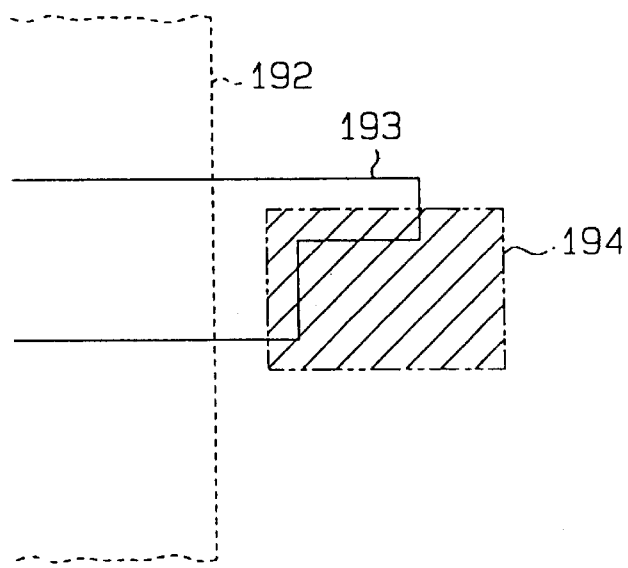
FIG. 2 is a diagram showing circuit components patterns in the vicinity of the boundary of a window.
Figure 3:
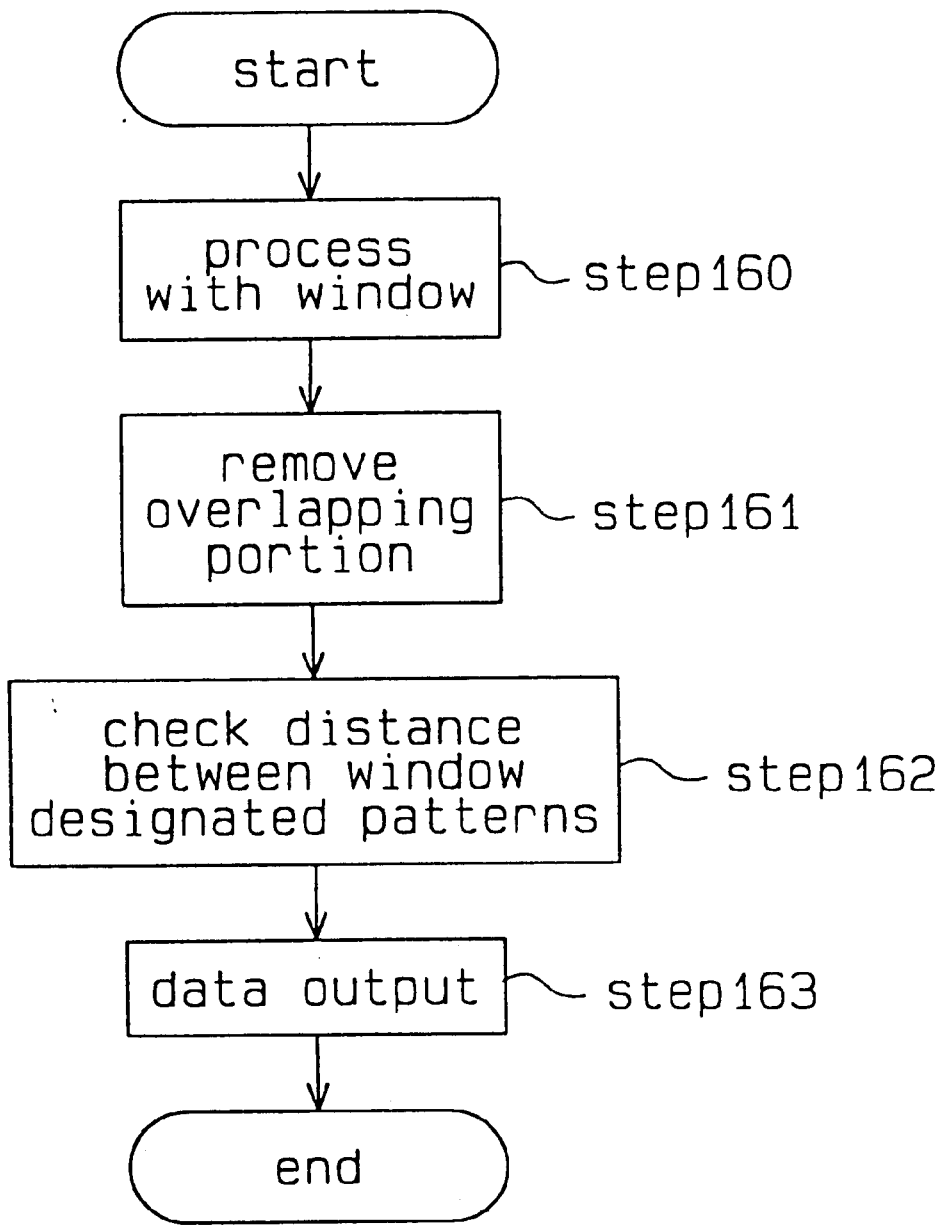
FIG. 3 is a flowchart illustrating the procedure of pattern data processing by using conventional CAD systems.
Figure 4A:
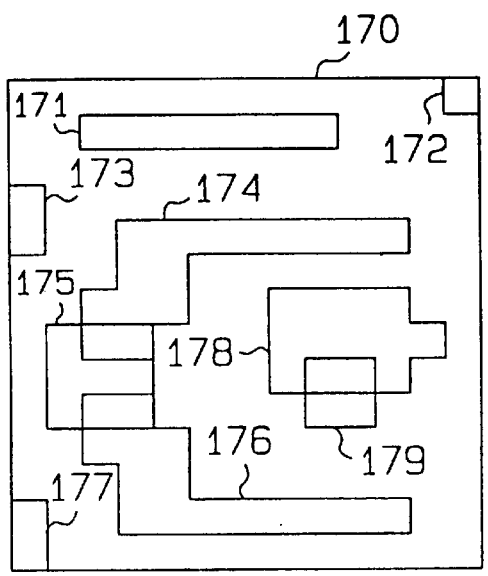
FIGS. 4A, 4B, 4C, 5A, 5B, 6A, 6B and 6C are diagrams illustrating a series of processing steps to obtain error indication patterns.
Figure 4B:
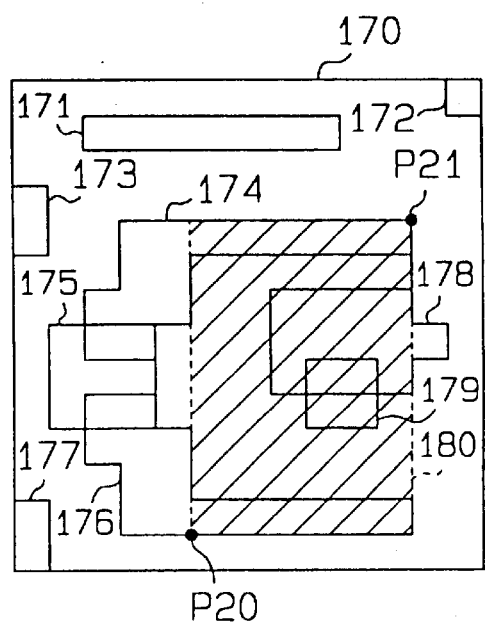
Figure 4C:
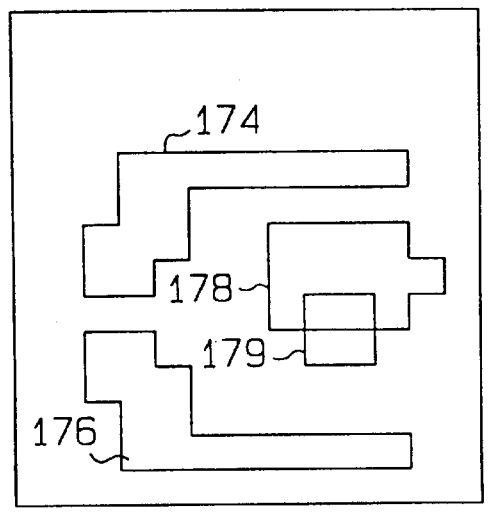
Figure 5A:
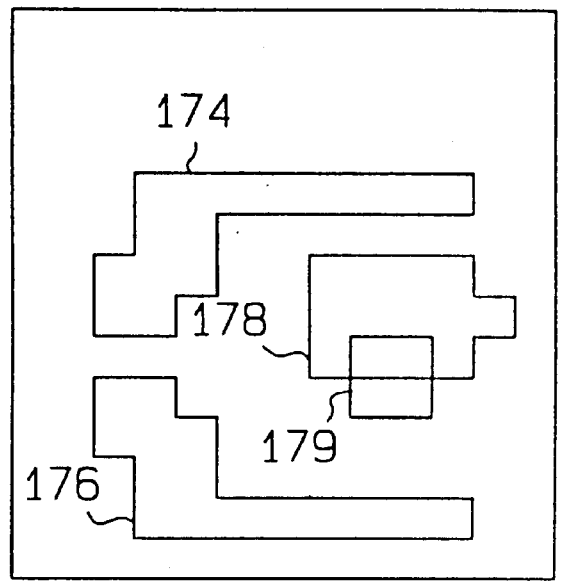
Figure 5B:
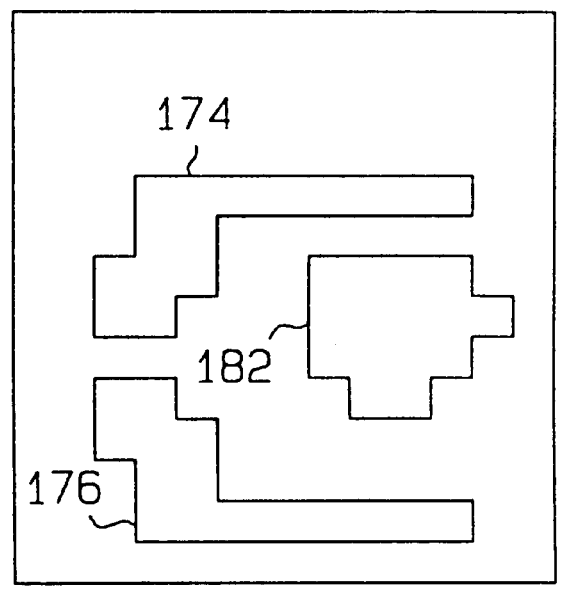
Figure 6A:
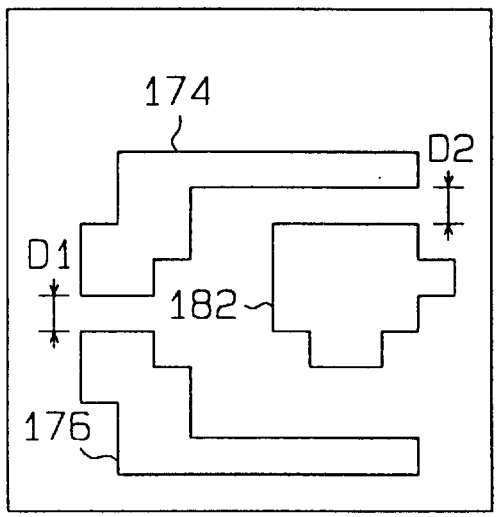
Figure 6B:
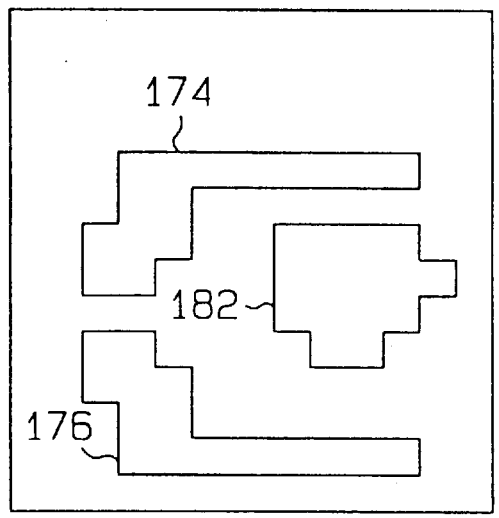
Figure 6C:
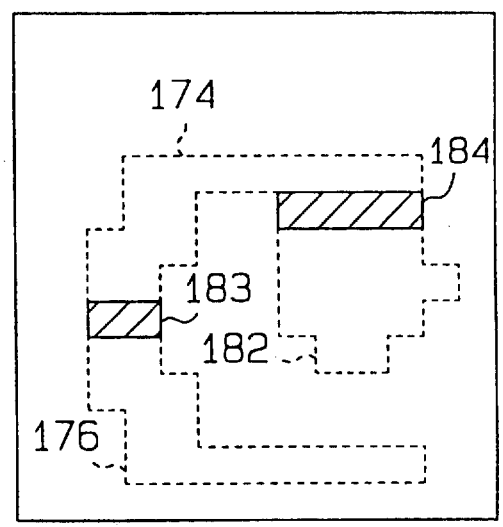
Figure 7:
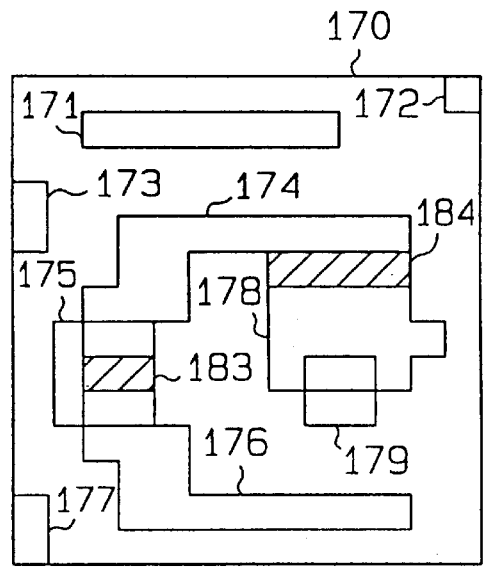
FIG. 7 is a diagram showing component patterns including the obtained error indication patterns.
Figure 8A:
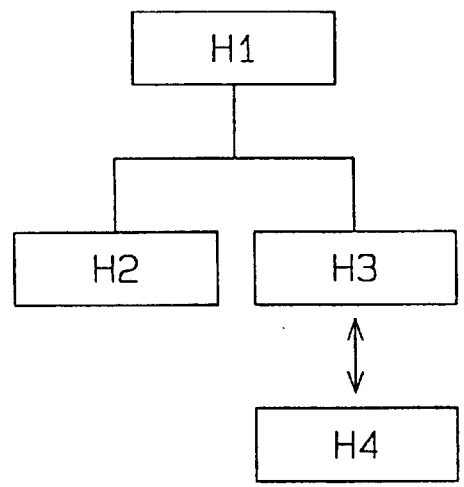
FIGS. 8A, 8B, 9A, 9B, 10A and 10B are diagrams illustrating first, second and third data managing systems.
Figure 8B:
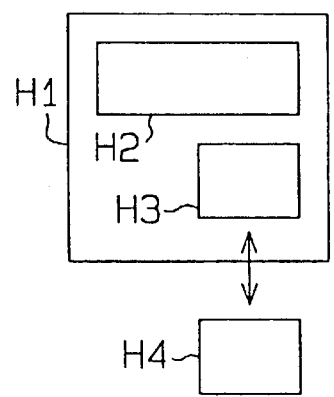
Figure 9A:
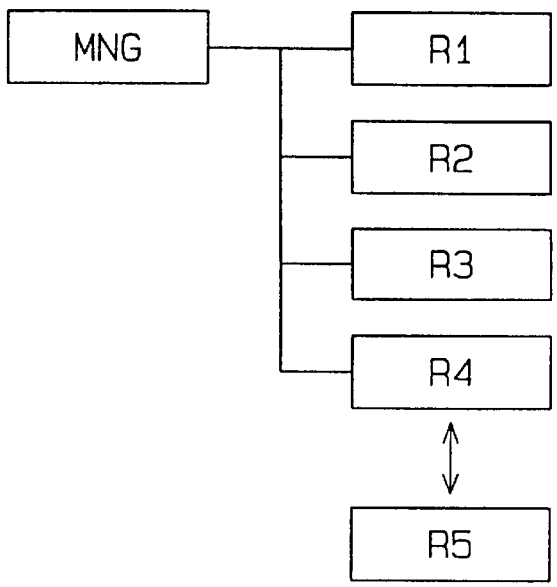
Figure 9B:
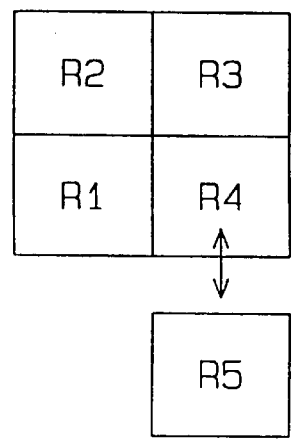
Figure 10A:
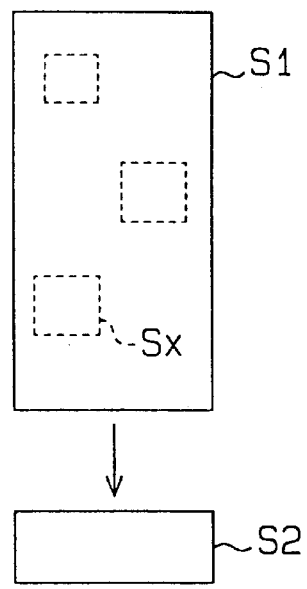
Figure 10B:
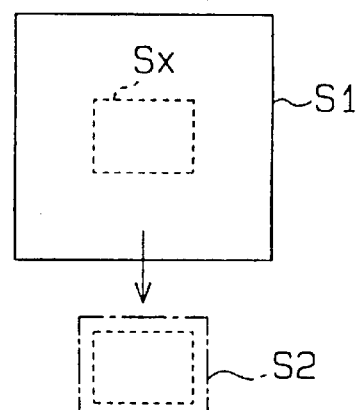
Figure 12:
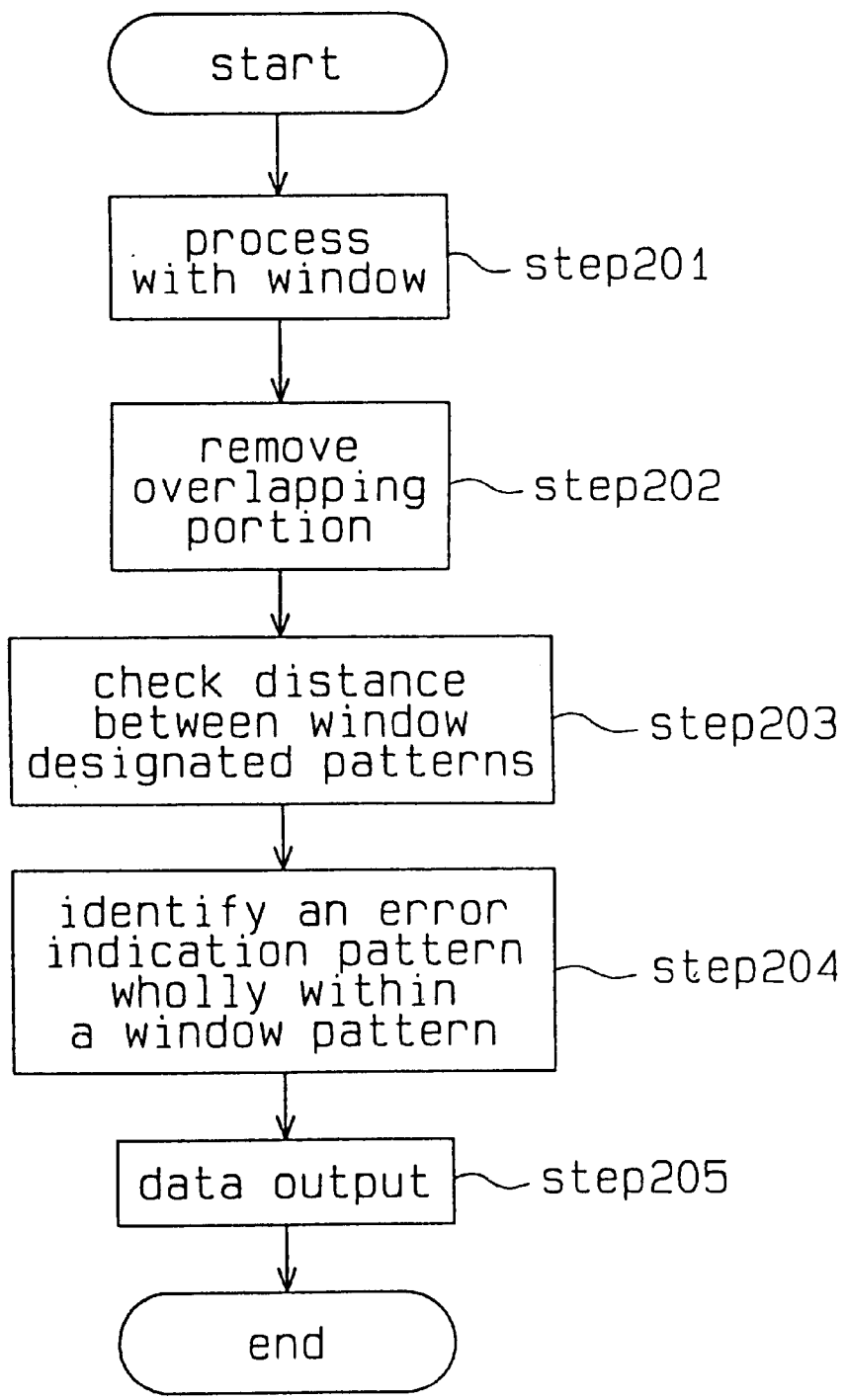

A first embodiment of the present invention will now be described with reference to FIGS. 11 through 21. FIG. 11 shows a circuit component pattern data processing device 1, incorporated in a CAD system to aid in the design of a semiconductor integrated circuit. As shown in FIG. 11, the pattern data processing device 1 has an input file 3, an intermediate file 4 and an output file 5. Each of the files 3, 4 and 5 are organized with a data base format. The processing device 1 further includes a processing unit 2, including a computer and executable computer programs, and a display 19 such as a CRT or a liquid crystal display. The processing unit 2 includes a data input section 6, an arithmetic logic unit (ALU) 10, a phase computing section 11, a distance checking section 12, a data output section 13, a register section 14 and a display control section 18.

Figure 16A:
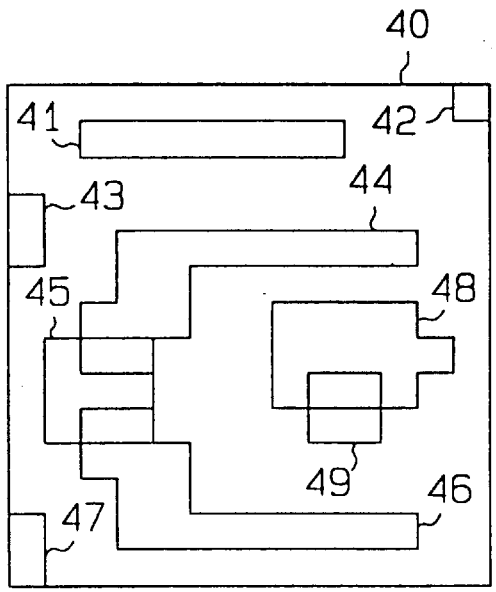
FIGS. 16A, 16B, 16C, 17A, 17B, 18A, 18B, 18C, 19A and 19B are diagrams illustrating a series of processing steps to obtain at least one error indication pattern.

The input file 3 stores data of circuit component pattern groups representative of the layout of a semiconductor device. This layout data is previously prepared and input to device 1 by a layout designer. FIG. 16A illustrates the layout, for example, of a portion of a semiconductor chip. Data descriptive of patterns 41–49, i.e. a pattern group 40, is registered in the input file 3. Pattern group data includes coordinate data indicative of the relative positions of each pattern in the pattern group 40.

The intermediate file 4 is provided that stores various kinds of component pattern data produced during data processing by processing unit 2. The output file 5 stores processed component pattern data following the completion of data processing by the processing unit 2.

The processing unit 2 receives control information 15, typically recorded on a recording medium such as a card or a magnetic tape. A reader (not shown) reads the control information 15 from the recording/medium and outputs it to the processing unit 2. The control information 15 includes, for example, window designating information, process control information and display control information. The control information 15 is previously prepared by the layout designer.

Figure 16B:
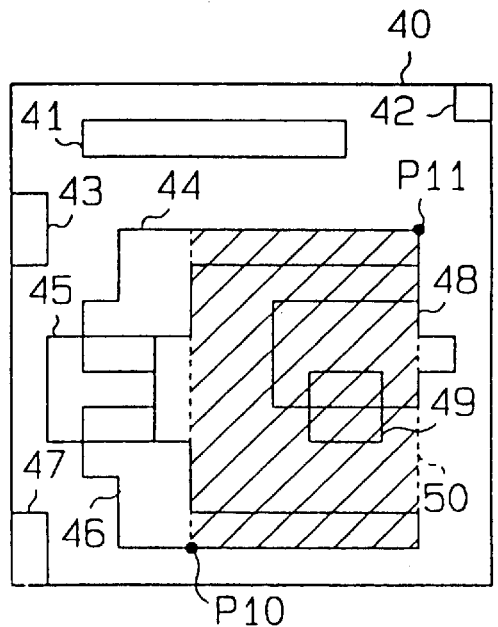

Window designating information is used to designate a window. A window is an area of the design layout that demarcates particular component patterns of a pattern group for data processing. One piece of window designating information is, for example, a pair of rectangular window coordinates, capable of being connected by orthogonal lines. As illustrated in FIG. 16B, the X and Y coordinates of window 50 in pattern group 40 are the points P10 and P11. The rectangular area, bounded by the orthogonal line connecting points P10 and P11, is designed as a window 50. This window 50 demarcates patterns 44, 46, 48 and 49 from patterns 41–49 as component pattern contained wholly or partially in window 50, windowed patterns 44, 46, 48 and 49 according to the present invention are subject to data processing.

Process control information instructions to the data input section 6, the ALU 10, the phase computing section 11, the distance checking section 12, the data output section 13 and the register section 14. More specifically, the control information includes:

1) Information to control the way which input section 6 receives component pattern group data from the input file 3, as well as the way input section 6 identifies the coordinates of the window relative to the component pattern group data;

2) Information to control the operation of the ALU 10 in processing pattern data, 3) Information to control the operation of the phase computing section 11 in processing pattern data, 4) Information to control the distance checking section 12 to check the distances between windowed component patterns against design specification pattern; and 5) Information to control the output of processed data from data to the output file 5.

In addition to the above control information, display control information 15 is provided to the display 19. This information controls the way in which preprocessed or processed pattern data is displayed.

The individual components of the pattern data processing device 1 will now be described. The data input section 6 has a window information input section 7, a data read section 8 and a data combining section 9. The window information input section 7 receives the control information 15 and outputs the data to the data read section 8. When the control information 15 includes window designating information, the window information input section 7 identifies the coordinates of the window relative to the component pattern group and outputs it to the data combining section 9.

The data read section 8 reads, for example, the data of the patterns 41–49, forming the pattern group 40 shown in FIG. 16A, from the input file 3 in accordance with the process control information included in the control information 15. Based on coordinate information contained in the control information 15, the data read section 8 designates, as the window 50, a rectangular area (shaded area) wherein specific windowed patterns from the pattern group 40 are selected as shown in FIG. 16B. Using process control information, the data read section 8 identifies the data of patterns entirely or partially within the window 50. Data read section 8 then outputs data descriptive of the entire pattern group 40 and of the windowed patterns to the display control section 18.

Figure 16C:
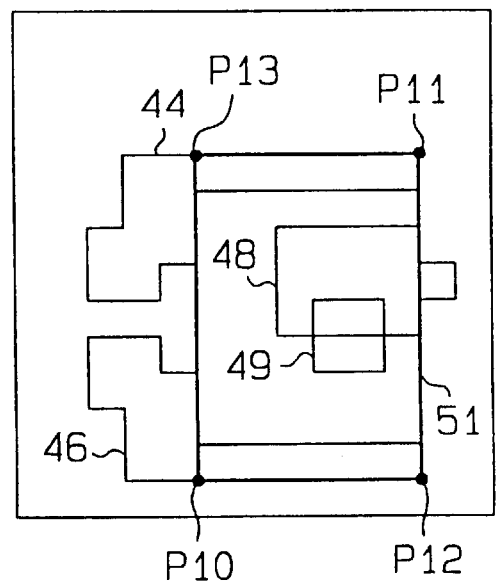

Based on the window designating information, the data combining section 9 produces the data descriptive of a rectangular window pattern 51 as shown in FIG. 16C. More specifically, data combining section 9 used the X and Y coordinates of the points P10 and P11 to extrapolate the X and Y coordinate data of the two points P12 and P13. The data combining section 9 next incorporates data descriptive of the window shape and of the particular substrate layer with the coordinate data of points P12 and P13.

Figure 13A:
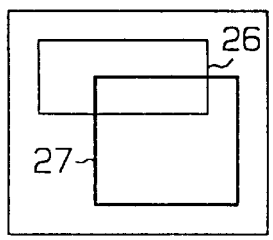
FIG. 13A is a diagram showing patterns to be subjected to an OR operation or an AND operation.
Figure 13B:
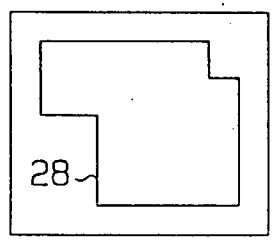
FIG. 13B is a diagram showing a pattern after the OR operation.
Figure 13C:
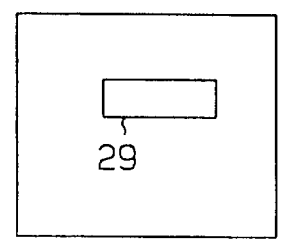
FIG. 13C is a diagram showing a pattern after the AND operation.

The ALU 10, phase computing section 11 and distance check section 12 perform data processing based on the window coordinate data and the component pattern data identified by the data read section 8. Given the occurrence of pattern overlap, the ALU 10 executes instructions contained in the control information 15 to yield a new single piece of pattern data in place of the overlapping component patterns resulting therefrom, the above described able operation is a significant feature of the CAD process. Assume, for example, that one layer includes a pattern 26 which overlaps a pattern 27 formed on adjacent layer. Pattern 26 would then overlap pattern 27 as shown in FIG. 13A. The ALU 10, in this instance, would execute a set of instruction, including an OR operating, to produce a single pattern 28 in which the overlapping portion is eliminated from patterns 26 and 27, as shown in FIG. 13B. Alternatively, the ALU 10 could perform an AND operation to produce the pattern data 29, i.e. the overlapping portion between the patterns 26 and 27, as shown in FIG. 13C.

Figure 14A:
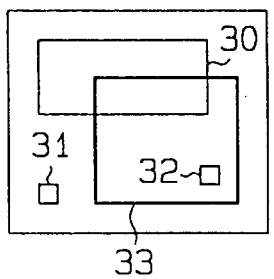
FIG. 14A is a diagram showing patterns to be subjected to a special data identification process.
Figure 14B:
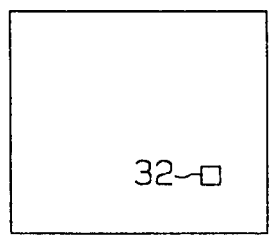
FIGS. 14B and 14C are diagrams exemplifying the result of the identification process.
Figure 14C:
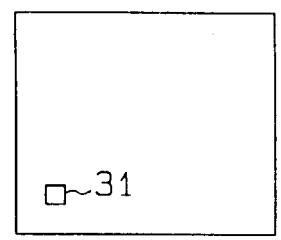

The phase computing section 11, using instructions contained in the control information 15, performs a phase operation on each pattern data for two different layers. The phase operation includes an operation for identifying pattern data on one layer which completely overlaps a pattern on another layer. The phase operation, in addition, identifies those patterns on one layer which are completely distinct or isolated from patterns on another layer. Suppose, for example, that one layer contains patterns 30 to 32 while the other layer contains a pattern 33 as shown in FIG. 14A. The phase computing section 11 may identify the data of the pattern 32, which is completely overlapped by the pattern 33, as shown in FIG. 14B. Alternatively, the phase computing section 11 may also identify the data of the pattern 31 completely isolated from the pattern 33, as shown in FIG. 14C.

Figure 15A:
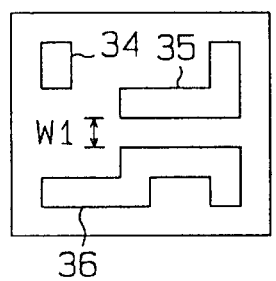
FIG. 15A is a diagram showing patterns to be subjected to a distance checking process.
Figure 15B:
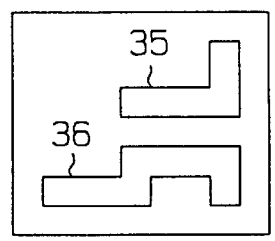
FIG. 15B is a diagram showing several patterns that do not satisfy design requirement.
Figure 15C:
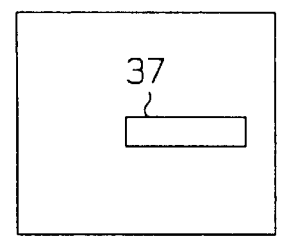
FIG. 15C is a diagram showing an error indication pattern.

In accordance with the process control information, the distance checking section 12 checks if the distance between patterns is equal to or smaller than that preset by design requirements. When the distance between the patterns is equal to or smaller than the prescribed distance, the distance checking section 12 produces error indication pattern data, indicating which patterns fail to meet design requirements. Suppose, for example, that patterns 34 to 36 exist as shown in FIG. 15A. Suppose further that the distance checking section 12 determines that the distance WI between the patterns 34 to 36 is equal to or smaller than that required by design specifications. In this situation, the distance checking section 12 produces and places an error indication pattern 37, between the patterns 35 and 36, indicating where the present design fails to meet the requirements of the design specification. Because error indication pattern 37 is rectangular, its pattern data includes data descriptive of the coordinates of the rectangle's individual vertexes as well as data identifying the layer on which the pattern is formed.

In accordance with the process control information, the register section 14 uses intermediate file 4 to store data of the pattern group 40, the individual patterns contained wholly or partially in the window 5, and window pattern data produced by the combining section 9. The window pattern data coordinate data of the window 51. Based on instructions contained in the control information 15, the register section 14 reads and writes (i.e. stores) the data of patterns needed for processing the ALU 10, phase computing section 11, distance check section 12 and data output section 13, from the intermediate file 4. The register section 14 in this way manages the component pattern data stored in the intermediate file 4 layer by layer. Further, the register section 14, based on control information 15 erases pattern data stored in the intermediate file 4 that is unnecessary for data processing. Finally, based on instructions from the display control section 18, the register section 14, reads the component pattern data from the intermediate file 4 and provides it via the display control section 18 to the display 19.

In accordance with the process control information, the data output section 13 formats the component pattern data and stores it in the output file 5. The data output section 13 outputs the component pattern data to the display control section 18 in accordance with the display control information. The contents of the displayed data includes:

1) Patterns received from OR identified by the data read section 8,

2) Patterns read from the intermediate file 4 by the register section 14, and

3) Patterns output from the data output section 13.

The processing which is executed by the pattern data processing device 1 according to this embodiment will now be described with reference to FIG. 12 and FIGS. 16 to 20.

At step 201, based on instructions contained in control information 15, the data read section 8 reads data descriptive of the patterns 41–49 (i.e. the pattern group 40) shown in FIG. 16A, from the input file 3. The read section 8 then outputs this data to the register section 14, which in turn stores the data in the intermediate file 4. When window designating information is affixed to the control information 15, the read section 8 designates the shaded area as the window 50 based on the coordinate data of the points P10 and P11, as shown in FIG. 16B. The read section 8 identifies the data of the patterns 44, 46, 48 and 49, i.e. those patterns entirely or partially in the window 50, from the data of the pattern group, as shown in FIG. 16C. The read section 8 sends the identified pattern data to the register section 14, which in turn stores the data in the intermediate file 4. The data combining section 9 receives the window designating information from the window information input section 7. The combining section 9 used the window designating information to produce window pattern data including coordinate data describing the four vertexes P10, P11, P12 and P13 of the window pattern 51, as shown in FIG. 16C. The combining section 9 next outputs the window pattern data to the register section 14, which in turn stores the data in the intermediate file 4.

Figure 17A:
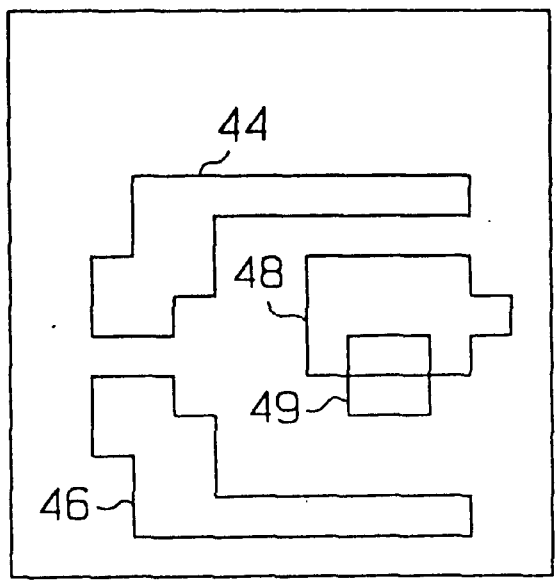
Figure 17B:
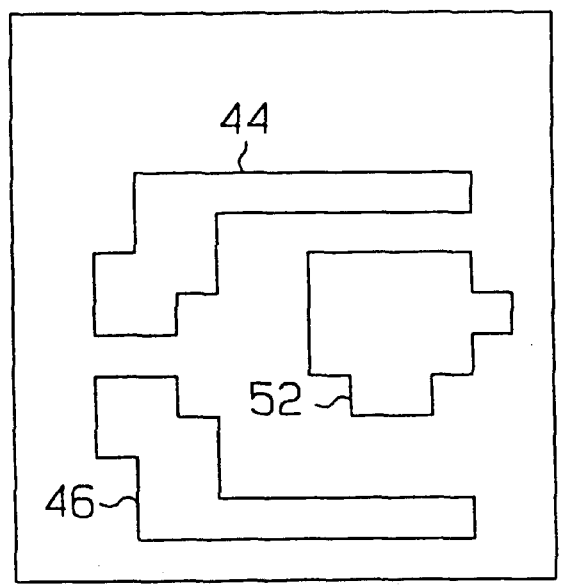

At step 202, the register section 14 reads the data descriptive of the patterns 44, 46, 48 and 49, shown in FIG. 17A, as process target data from the intermediate file 4, and supplies the data to the ALU 10 in accordance with the process control information. The ALU 10 in turn determines if there is an overlapping portion in the patterns, as between patterns 48 and 49 in this example. The ALU then performs a logical OR operation to remove the overlapping portion of the patterns. The ALU 10 next produces the data of a replacement pattern 52, as shown in FIG. 17B, and provides processed pattern data, i.e., the data of the patterns 44, 46 and 52, to the register section 14. Register section 14 next stores the data in the intermediate file 4.

Figure 18A:
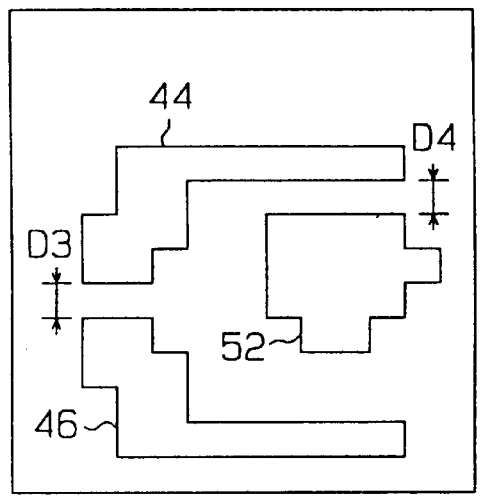

At step 203, the register section 14 reads the data descriptive of patterns 44, 46 and 52 shown in FIG. 18A from the intermediate file 4 and supplies it to the distance checking section 12.

Figure 18B:
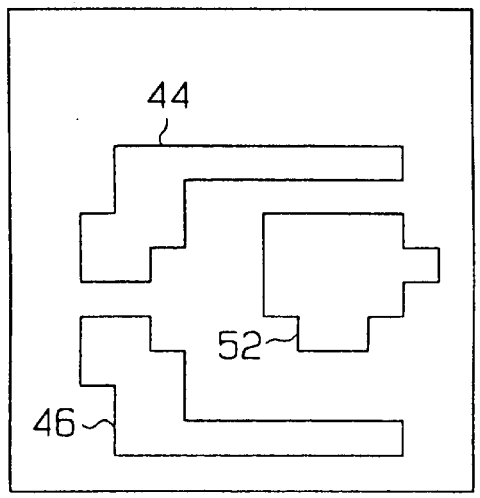

If the distance checking section 12 determines that the shortest distance between windowed patterns is equal to or less than that called for by circuit specifications, then error indication patterns are generated. As illustrated here, the distance checking section 12 determines that distance D3 separating patterns 44 and 46 is equal to or less than that called for by design specifications. The same is determined for distance D4 separating patterns 44 and 52. Consequently, the distance checking section 12 determines that the patterns 44, 46 and 52 fail to meet design specifications, as shown in FIG. 18B.

Figure 18C:
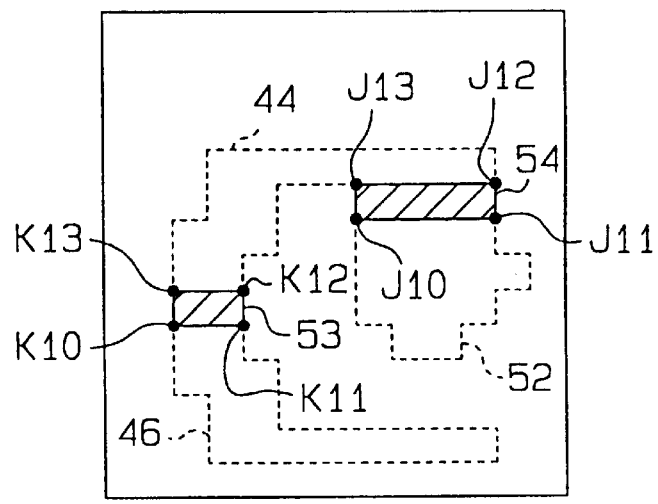

The distance check section 12 then generates an error indication pattern between pattern pairs 44, 46 and 44, 52, as shown in FIG. 18C. Data descriptive of the error indication pattern 53 includes vertex data K10 to K13. Likewise, data descriptive of the error indication pattern 54 includes vertex data J10 to J13. The distance checking section 12 outputs the data descriptive of the patterns 44, 46, 52, 53 and 54 to the register section 14, which in turn stores the data in the intermediate file 4.

Figure 19A:
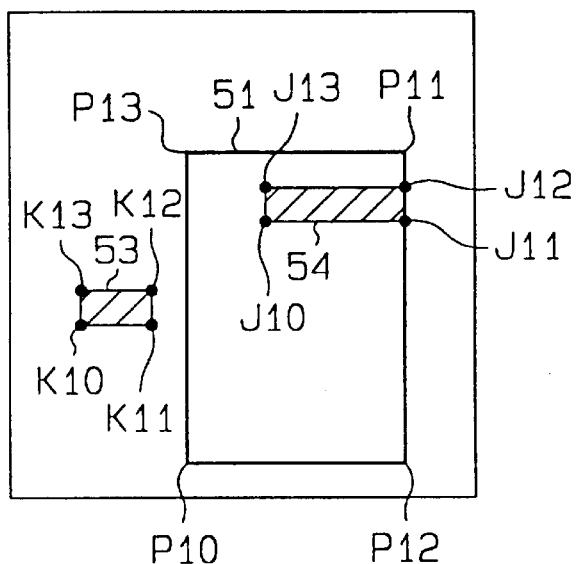
Figure 19B:
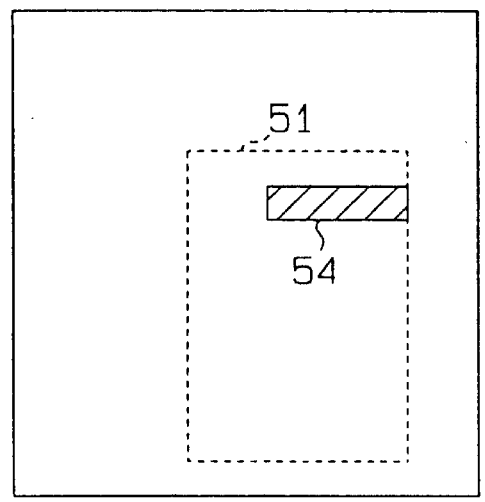
Figure 20:
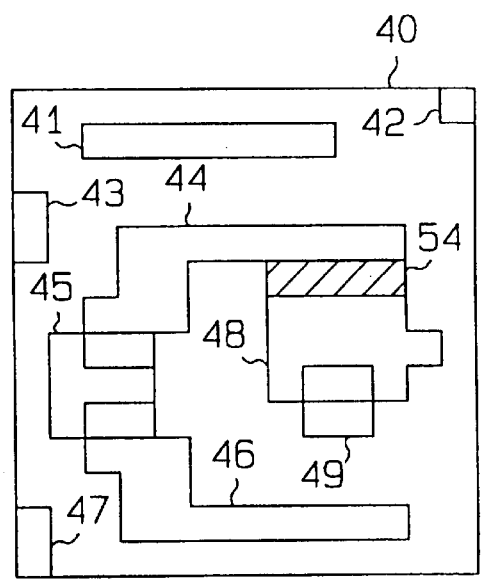

In step 204, in accordance with the process control information, the register section 14 information stored in file 4 the data descriptive of error indication patterns 53 and 54 and of the window pattern 51, as shown in FIG. 19A. This information is next provided to the phase computing section 11. Based on instructions contained in the process control information, the phase computing section 11 identifies the error indication patterns(s) completely within the window pattern 51. Importantly, the phase computing section 11 does not identify error indication pattern(s) 53 partially or wholly outside the window pattern 51. This is shown in FIG. 19B where only the error indication pattern 54 is identified, due to it being completely within the window pattern 51. The above described data identification is performed for each layer of the semiconductor. As shown here component pattern 45 is on a different layer than patterns 44 and 46. Likewise component pattern 49 is on a different layer than is pattern 48. Therefore, as illustrated, error pattern identification is performed based on vertexes P10 to P13 on one layer, and on vertexes K10–K13 and J10–J13, as coordinates of error indication patterns on another layer. The phase computing section 11 provide the indication pattern 54 to the register section 14, which in turn stores it in the intermediate file 4.

In step 205, the register section 14 acquires pattern data descriptive of the patterns 41 to 49 and 54 from the intermediate file 4. This data is then provided to the data output section 13. In accordance with the process control information, the data output section 13 combines the data of the indication pattern 54 to the data of the patterns 41 to 49, and then stores the resulting data in the output file 5. The data output section 13 next provides this data to the display control section 18. The display control section 18 displays the patterns 41–49 54 on the display 19.

In this embodiment, the data combining section 9 produces the data of the window pattern 51. This allows the data processing device of the present invention to distinguish data relevant to the designer from data irrelevant to the designer. With window coordinates selected as shown in FIG. 16A–20, the phase computing section 11 distinguishes the pattern 54 as data relevant to the designer. Pattern 53 is not identified as wholly within the window pattern 51 and therefore is not output to the output file 5. The advantage this provides is an overall increase in data processing reliability and efficiency. The circuit designer, according to the present invention, no longer needs to verify the accuracy of the displayed error indication patterns. By using the above described phase operation, window pattern data can be used to identify only those patterns which in fact fail to meet design specifications. This improves the efficiency of the distance checking process.

Second Embodiment

A second embodiment of this invention will now be described below with reference to FIG. 21 through 34. For the sake of the explanatory convenience, like or same reference numerals used for the components of the pattern data processing device 1 shown in FIG. 11 will also be used to describe the second embodiment.

Figure 21:
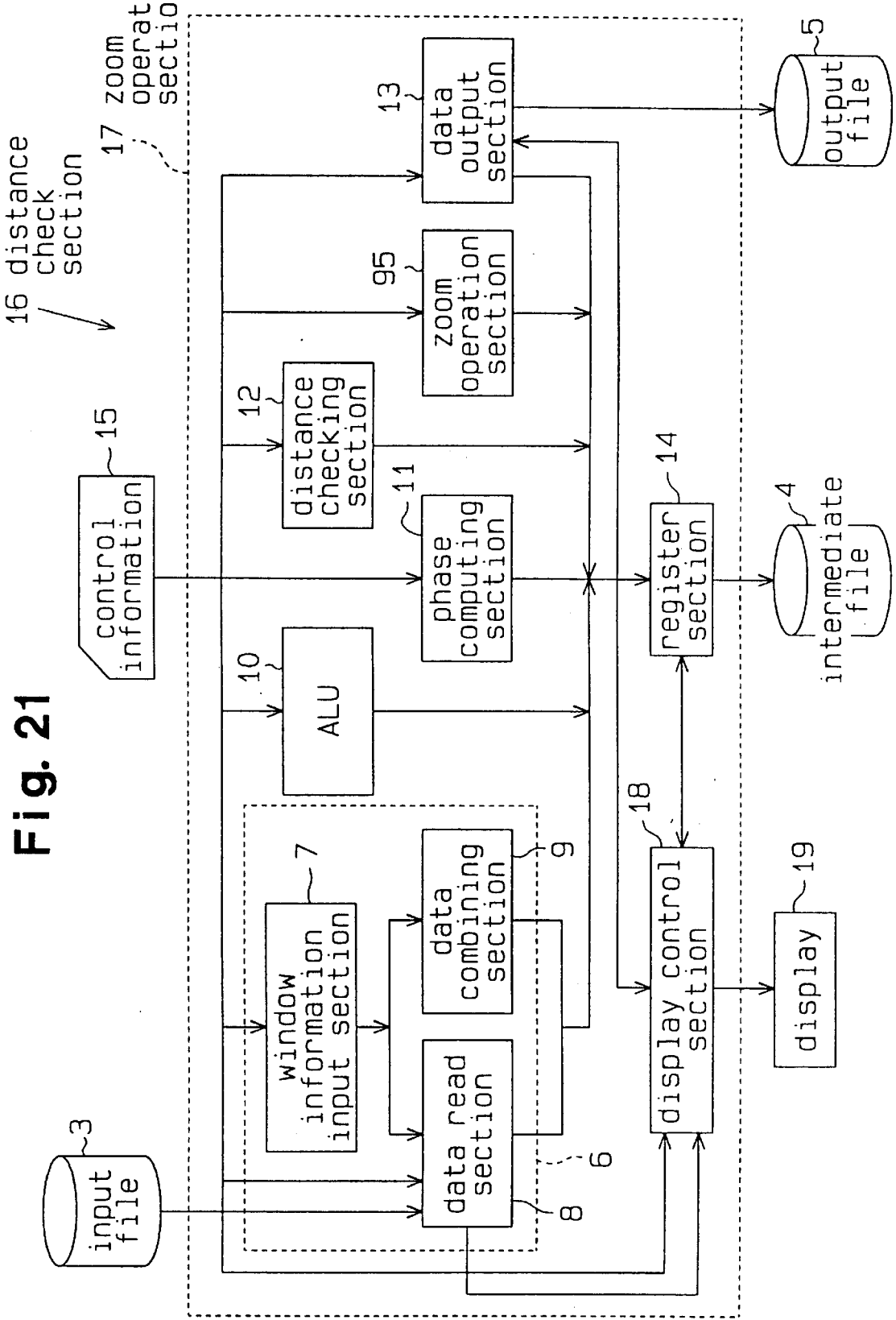
Figure 25A:
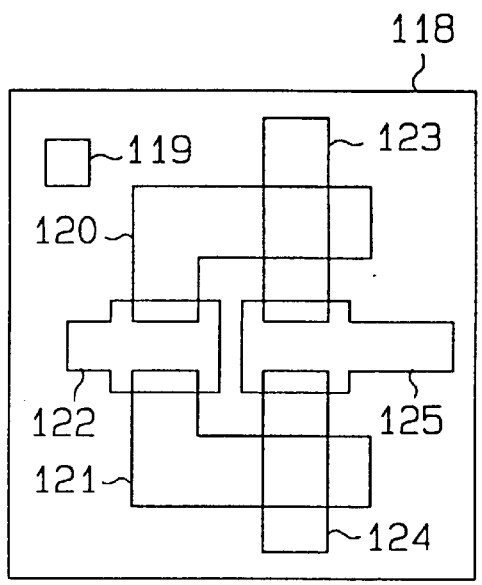
FIGS. 25A, 25B, 25C, 26A, 26B, 27A, 27B, 28A, 28B, 29A, 29B, 30A, 30B, 31A, 31B, 32A, 32B, 33A and 33B are diagrams illustrating a series of processing steps to obtain a redesigned circuit component pattern.
Figure 25B:
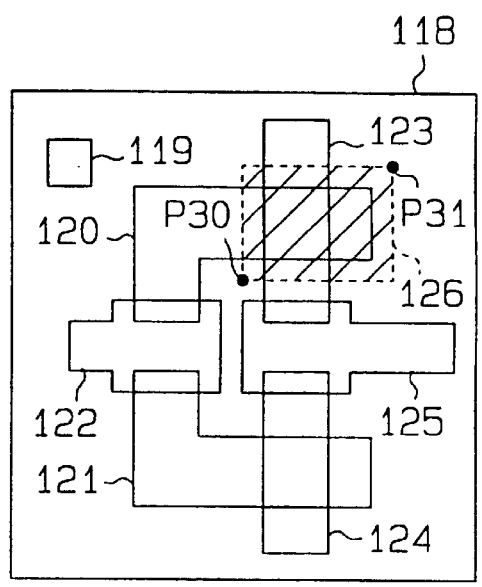
Figure 34:
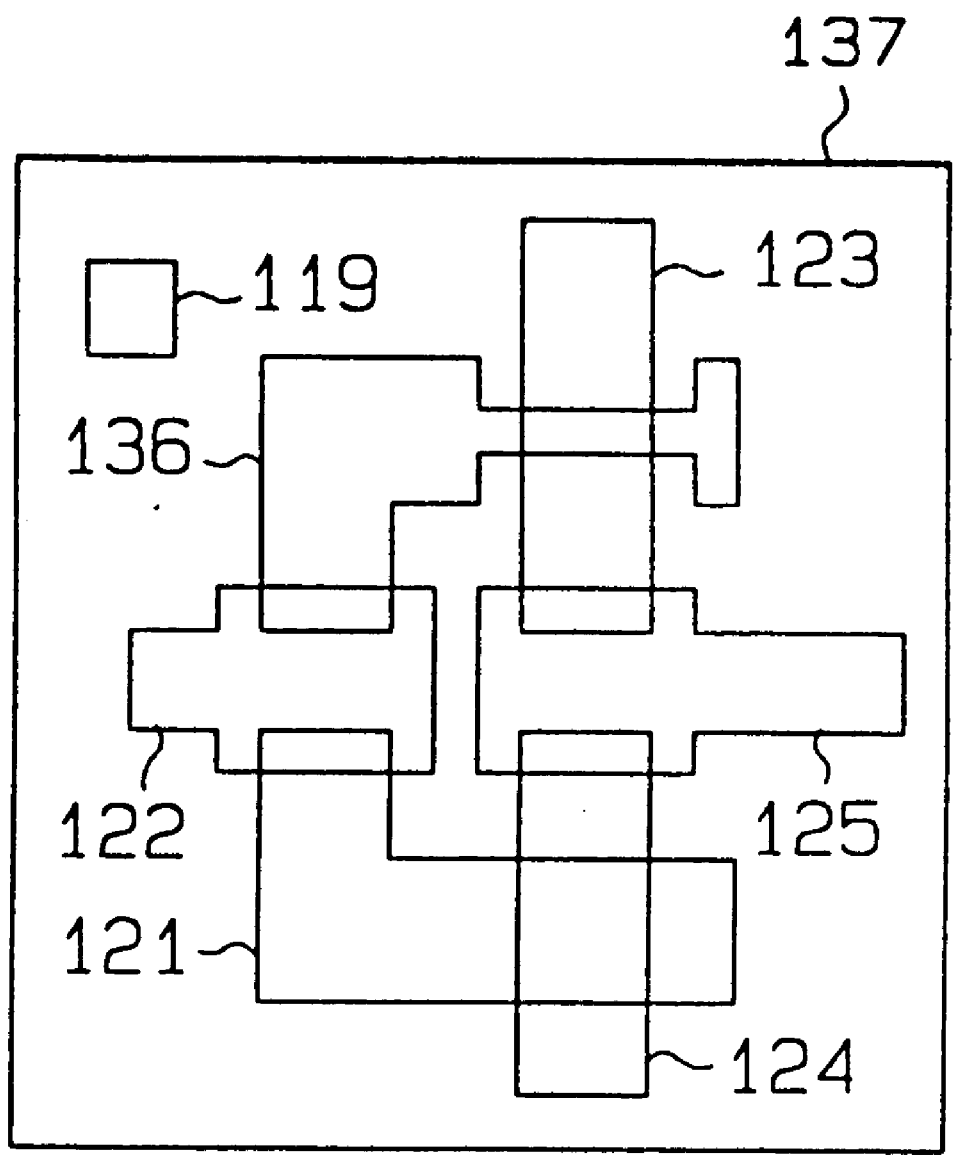

FIG. 21 shows a pattern data processing device 16 according to the second embodiment. This pattern data processing device 16, like the first embodiment, processes pattern data extracted by the window designation. This processing may be adapted for the layout design of an MOS transistor having three-layer structure. As shown in FIG. 25A, the transistor has a laminated structure including a polysilicon layer (polycrystalline silicon layer) indicated by patterns 119, 120 and 121, a diffusion layer indicated by patterns 123 and 124 and a metal wire layer indicated by patterns 122 and 125. For such MOS transistors, reducing the area of the overlapping portion between the polysilicon layer (pattern 120) and the diffusion layer (pattern 123) reduces the area of the gate region of the MOS transistor. In general, changing the area of the gate region of a transistor changes various characteristics, such as gate capacitance and switching speed. Therefore, redesigning a portion of a transistor pattern group, designated by a window area as shown in FIG. 25B, to that of a pattern equivalent to that shown in FIG. 34, is a process ideally suited for a CAD process.

Figure 22A:
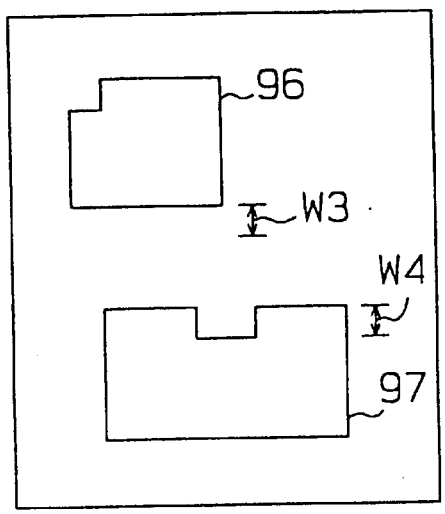
FIG. 22A is a diagram showing patterns to be subjected to zoom-up and zoom-down operations.
Figure 22B:
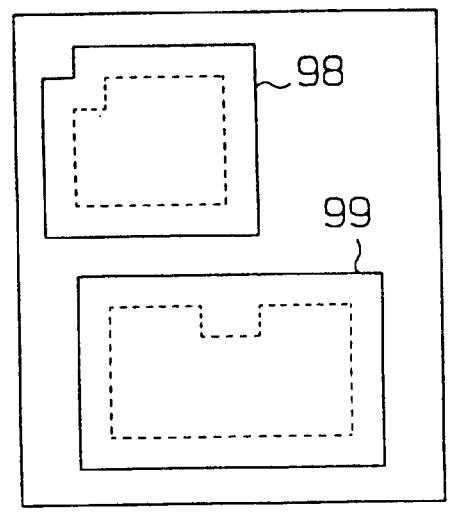
FIG. 22B is a diagram showing enlarged patterns in accordance with the zoom-up operation.
Figure 22C:
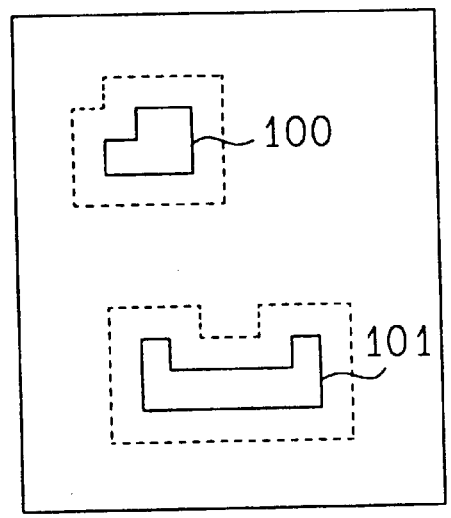
FIG. 22C is a diagram showing reduced patterns in accordance with the zoom-down operation.

As shown in FIG. 21, a processing unit 17 of the pattern data processing device 16 has a zoom operation section 95, a data input section 6, ALU 10, phase computing section 11, distance check section 12, data output section 13 and register section 14. The zoom operation section 95 magnifies or reduces the size of a pattern included in a layer and window specified by the control information. An equivalent pattern is thereby produced. Suppose, for example, that patterns 96 and 97, when in FIG. 22A, are present on the designated layer and that process control information requires magnification of pattern 94 by width W3 and reduction of pattern 97 by width W4. Based on these requirements, the zoom operation section 95 produces data descriptive of enlarged patterns 98 and 99. Both patterns 98 and 99 have shapes similar to those of patterns 96 and 97, as shown in FIG. 22B. Using width W4 and patterns 96 and 97, the zoom operation section 95 produces patterns 100 and 101, both of which are respectively similar in shape to the patterns 96 and 97 as shown in FIG. 22C.

Figure 23A:
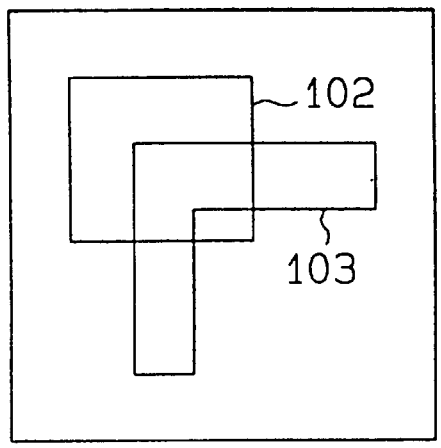
FIG. 23A is a diagram showing patterns to be subjected to a SUB operation.
Figure 23B:
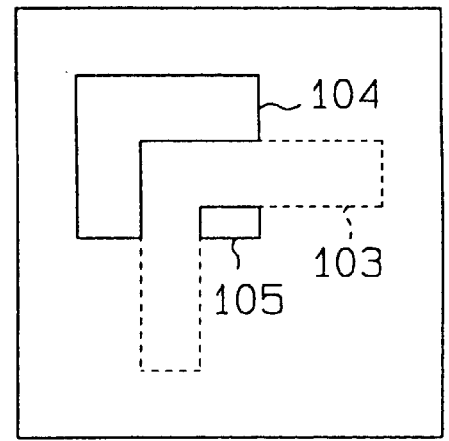
FIGS. 23B and 23C are diagrams illustrating examples of the results of the SUB operations.
Figure 23C:
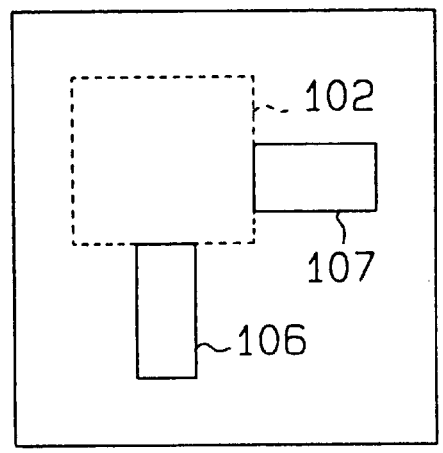
Figure 24:
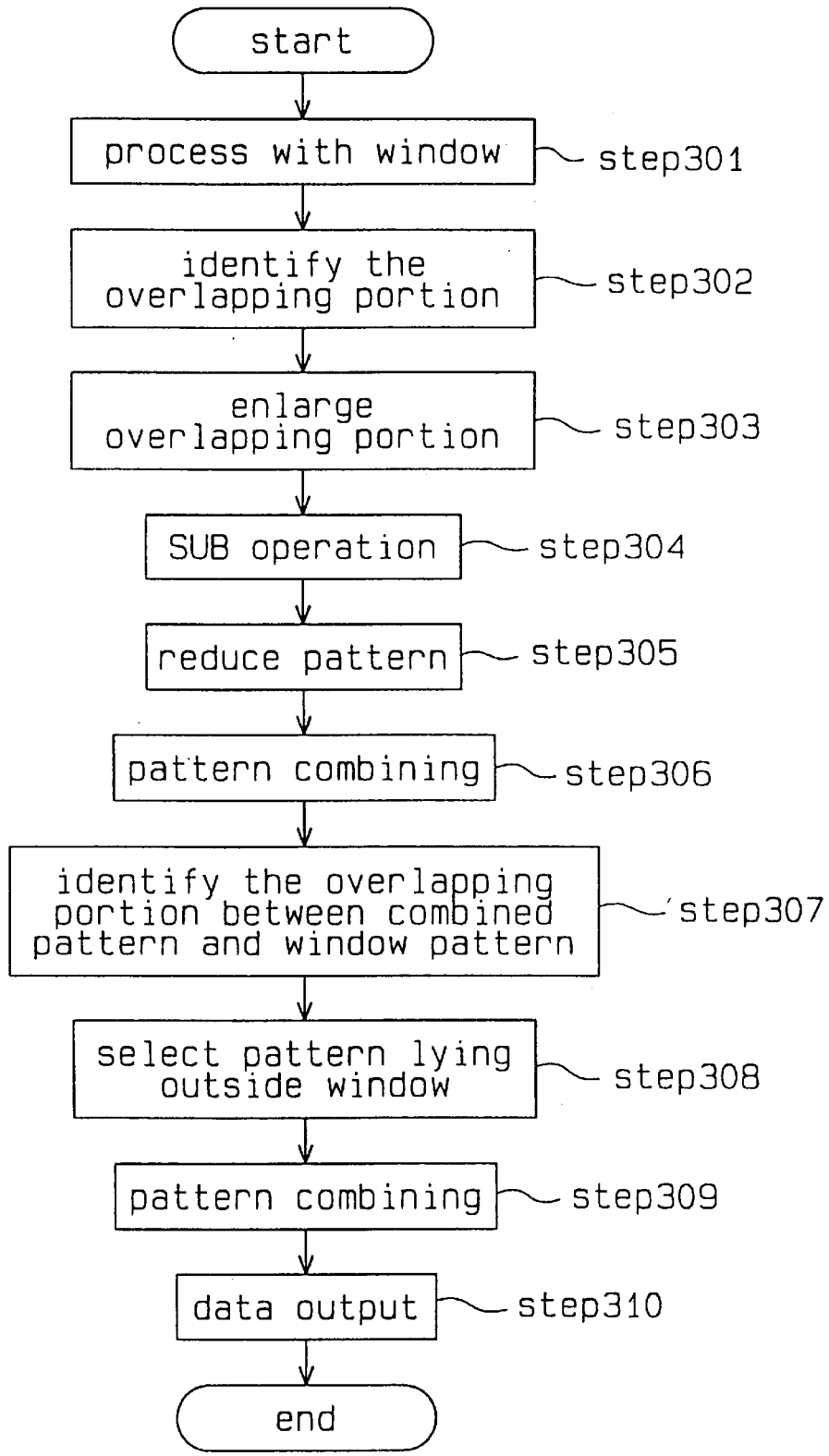

In accordance with the process control information, the ALU 10 performs a SUB operation in addition to the OR and AND operations as explained in the first embodiment. The SUB operation is performed between or among a plurality of patterns included in different layers. When successive layers contain overlapping patterns, the SUB operation eliminates the overlapping portion from the pattern on one of the layers. This is illustrated, as shown in FIG. 23A, with overlapping patterns 102 and 103 formed on respectively different layers. Based on the process control information and on the patterns 102 and 103, the ALU 10 eliminates overlapping portion from the pattern 102, producing two patterns 104 and 105, as shown in FIG. 23B. The ALU 10 then eliminates the overlapping portion from the pattern 103, producing two patterns 106 and 107, as shown in FIG. 23C.

The other components, namely, the data input section 6, phase computing section 11, distance check section 12, data output section 13 and register section 14 have the same structure and function as those of the first embodiment.

The pattern processing by the pattern data processing device 16 according to this embodiment will be discussed below with reference to FIGS. 24 to 34. In step 301, the data read section 8 reads control information 15 and data descriptive of a pattern group 118 including patterns 119 to 125 shown in FIG. 25A. The pattern group data is then provided by the data read section 8 to the intermediate file 4. The pattern group 118 comprises the patterns 119, 120 and 121 formed on layer A (a polysilicon layer), the patterns 123 and 124 formed on layer B (a diffusion layer), and the patterns 122 and 125 formed on layer C (a metal wire layer).

Figure 25C:
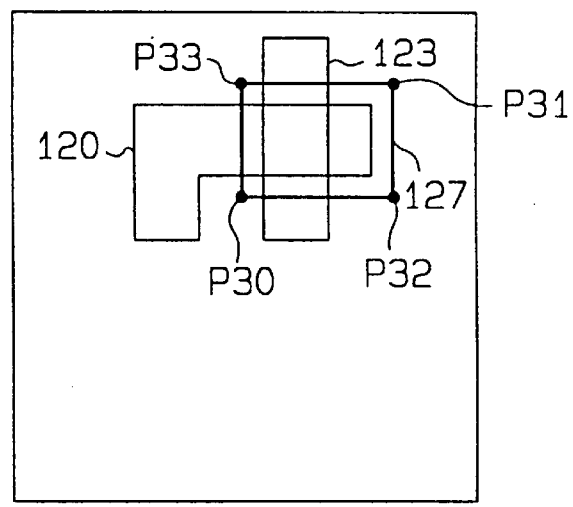

The data read section 8 then designates a window based on window designating information included in the control information 15. As shown in FIG. 25B, window designating information includes the X and Y coordinates of points P30 and P31. Using these coordinates, the data read section 8 designates the shaded area as a window 126. The read section 8 identifies patterns contained either entirely or partially within the window 126. As shown in FIG. 25c, read section 8 identifies patterns 120 and 123 from the data of the pattern group 118, and stores the data in the intermediate file 4 via the register section 14. The data combining section 9 produces data descriptive of a window pattern 127, based on the window the coordinates P30 and P31. The window pattern data includes vertex coordinates P30 and P31 along with the new vertex coordinates P32 and P33. The data combining section 9 stores the window pattern data in the intermediate file 4 via the register section 14.

Figure 26A:
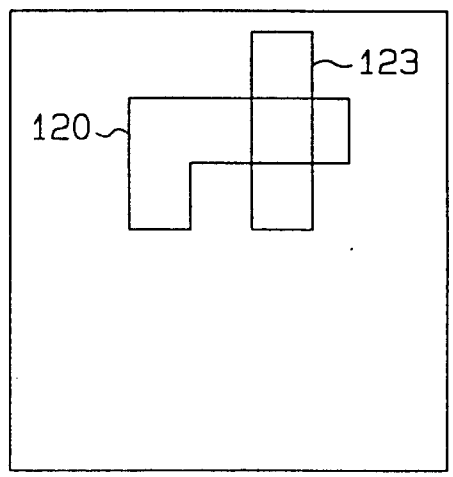
Figure 26B:
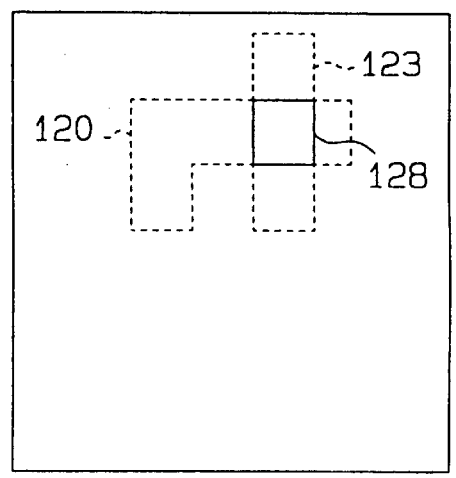

In step 302, the ALU 10 reads data of descriptive the patterns 120 and 123 from the intermediate file 4 via the register section 14, as shown in FIG. 26A. The ALU 10 executes an AND operation on the patterns 120 and 123 to produce data descriptive of a pattern 128. This pattern 128 indicates on identifies the overlapping portion of both patterns, as shown in FIG. 26B. The ALU 10 next stores pattern 128 data in the intermediate file 4 via the register section 14.

Figure 27A:
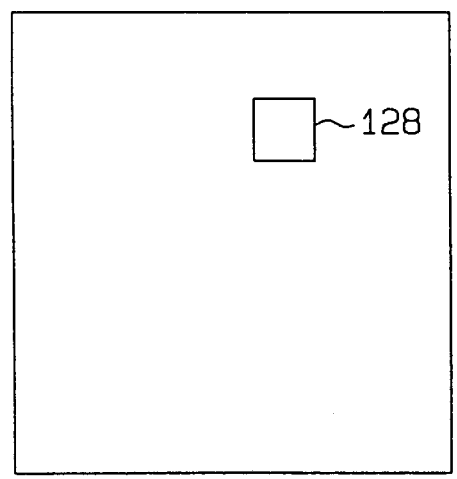
Figure 27B:
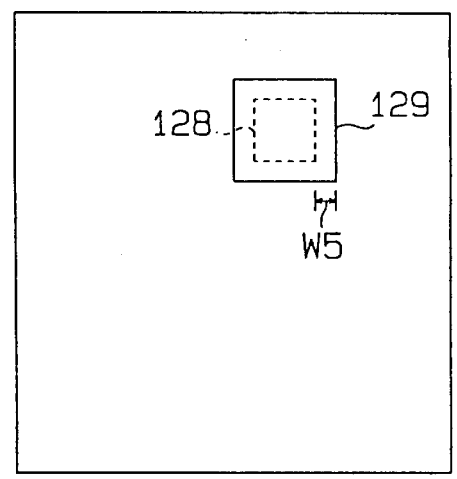

In step 303, the zoom operation section 95 reads data descriptive of the overlapping pattern 128 from the intermediate file 4 via the register section 14, as shown in FIG. 27A. The zoom operation section 95 enlarges the outline of the overlapping pattern 128 based on width W5 to produce a pattern 129 as a substitute for the pattern 128, as shown in FIG. 27B. Data descriptive of the pattern 129 is then stored in the intermediate file 4 via the register section 14.

Figure 28A:
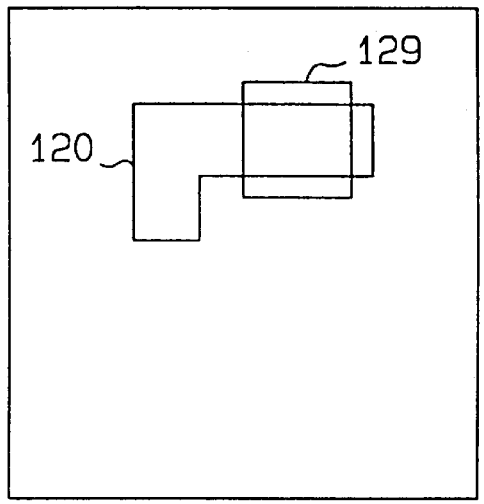
Figure 28B:
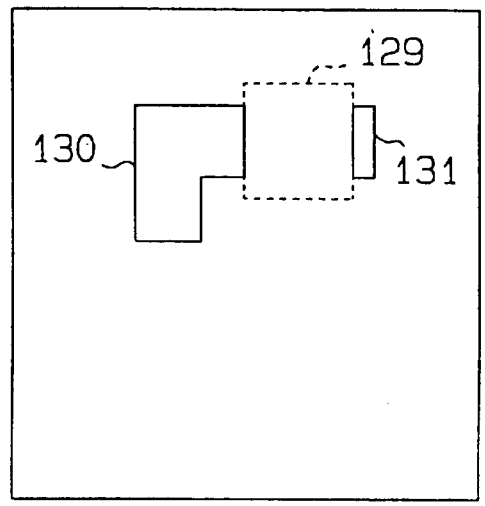

In step 304, the ALU 10 executes a sub operation on the patterns 120 and 129 read from the intermediate file 4 via the register section 14. The SUB operation effectively replaces patterns 120 and 129 with patterns 130 and 131, as shown in FIG. 28B. The portion removed from pattern 120 is that portion of pattern 120 which overlapped the pattern 129. The ALU 10 stores the data of patterns 130 and 131 in the intermediate file 4 via the register section 14.

Figure 29A:
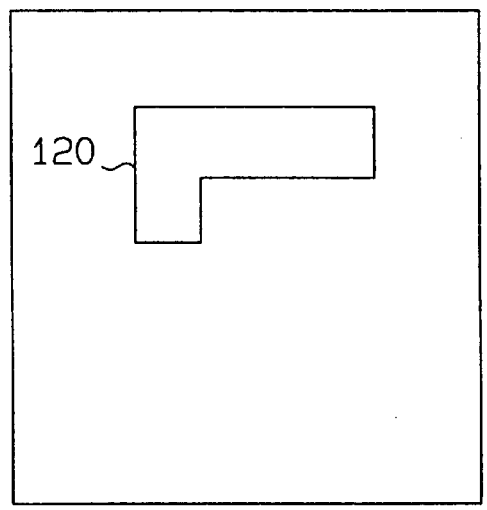
Figure 29B:
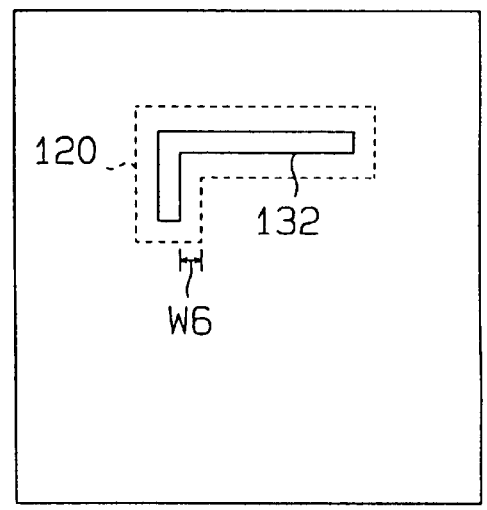

In step 305, the zoom operation section 95 reads data descriptive of pattern 120 from the intermediate file 4 via the register section 14. The pattern 120, shown in FIG. 29A, is, for example, formed on a polysilicon layer (A layer). The zoom operation section 95 reduces the outline of the pattern 120 by a width W6 to produce a single similar pattern 132 as a replacement for the pattern 120 shown in FIG. 29B. The zoom operation section 95 next stores the data descriptive of the pattern 132 in the intermediate file 4 via the register section 14.

Figure 30A:
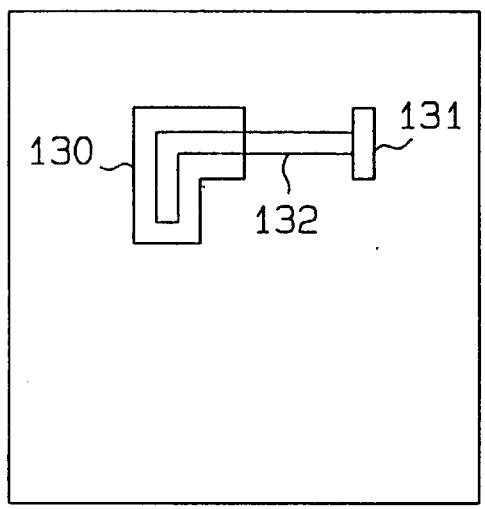
Figure 30B:
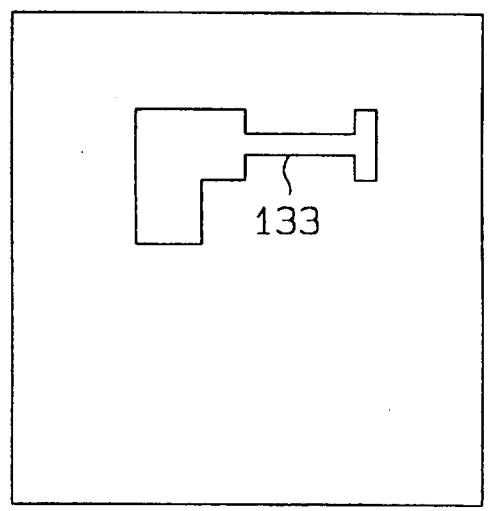

In step 306, the ALU 10 reads data descriptive of the patterns 130, 131 and 132, shown in FIG. 30A, from the intermediate file 4 via the register section 14. The ALU 10 then executes an OR operation to combine the patterns 130, 131 and 132. This combination produces a single pattern 133, as shown in FIG. 30B, which replaces the patterns 130–132. The ALU 10 stores data descriptive of the combined pattern 133 in the intermediate file 4 via the register section 14.

Figure 31A:
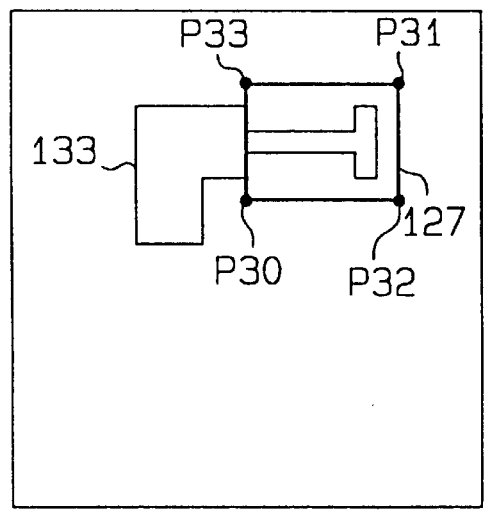
Figure 31B:
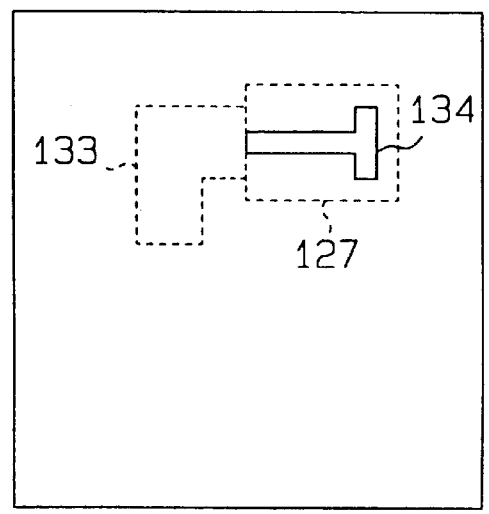

In step 307, the ALU 10 executes an AND operation on data descriptive of the combined pattern 133 and on the window pattern data after reading both from the intermediate file 4 via the register section 14. The AND operation to effectively identifies the overlapping portion of patterns 127 and 133 to produce a single pattern 134, as shown in FIG. 31B. The pattern 134 is used to replace patterns 127 and 133. The ALU 10 stores the data of the pattern 134 in the intermediate file 4 via the register section 14.

The above described process can be summarized as follows. When patterns such as 120 and 121, formed on a single semiconductor layer, overlap portions of patterns 123 and 124 formed on a adjacent semiconductor layer, control information is input that designates one portion of the overlapping patterns. The data processing device, according to present invention, then performs a pattern enlargement reduction, and combination shown in FIG. 25A through 30A, to obtain a single pattern 133. The reduced portion of the pattern 133 corresponds to the gate of the polysilicon layer. The pattern 134 is extracted as shown in FIG. 31B. The resulting pattern 134 is the image of the combined pattern 133, which lies in the window pattern 127. The portion of the combined pattern 133 outside the window pattern 127 is not extracted and is removed.

Figure 32A:
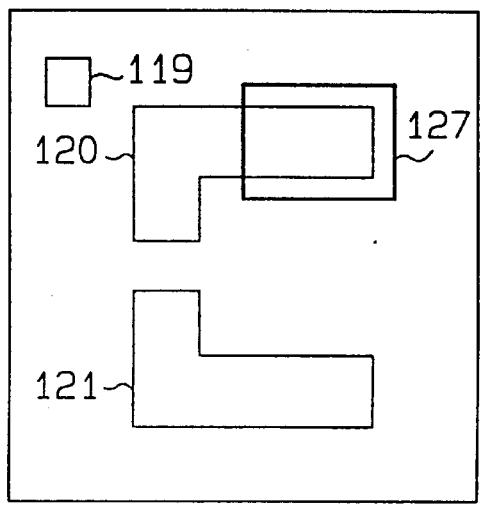
Figure 32B:
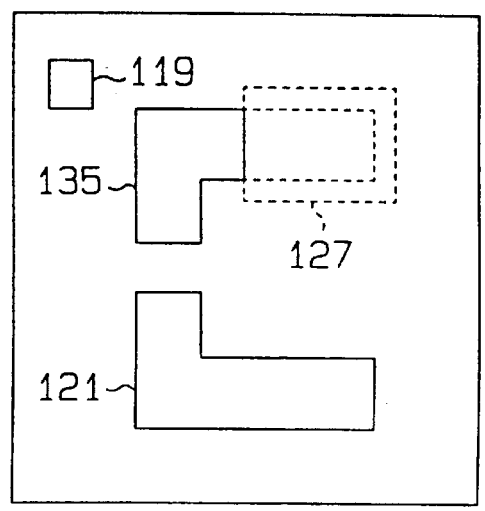

In step 308, the ALU 10 reads the data of all patterns 119–121 on the A layer and the data of the window frame pattern 127 from the intermediate file 4 via the register section 14, as shown in FIG. 32A. The ALU 10 executes the SUB operation to remove the portion of the pattern 120 overlapping the pattern 127 from the pattern 120, thus producing the data of a single pattern 135, as shown in FIG. 32B, which replaces the patterns 120 and 127. This pattern 135 is the image of the part of the pattern 120 on the A layer, which exists outside the window (true process target area). The ALU 10 stores the data of the patterns 119, 135 and 121 in the intermediate file 4 via the register section 14.

Figure 33A:
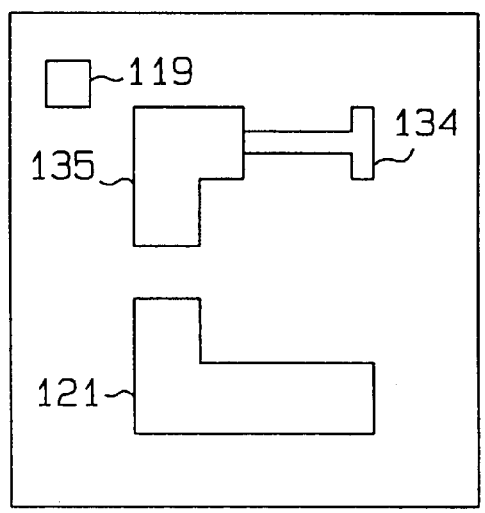
Figure 33B:
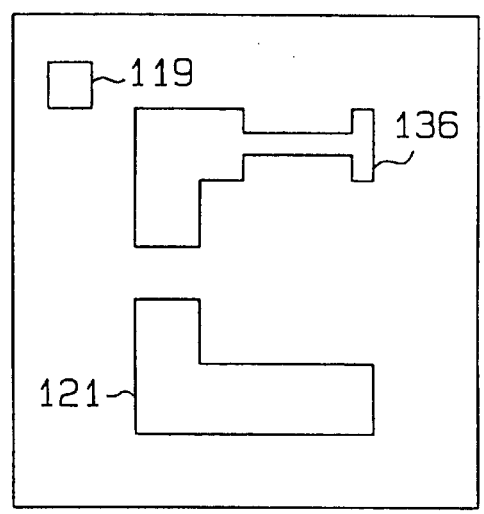

In step 309, the ALU 10 reads the data of the patterns 119, 121, 134 and 135 from the intermediate file 4 via the register section 14, as shown in FIG. 33A. The ALU 10 executes the OR operation to combine those patterns to produce the data of a single pattern 136, as shown in FIG. 33B, which replaces the patterns 134 and 135. This pattern 136 is the image of what is obtained by removing the contact portion between the patterns 134 and 135. The generation of the data of this pattern 136 permits the data of the pattern 134, extracted using the data of the window frame pattern 127, to be included in the data of the original pattern group 118. The ALU 10 then stores the data of the patterns 119, 136 and 121 in the intermediate file 4 via the register section 14. The data of the patterns 119, 136 and 121 are obtained as the result of the processing of all the original patterns 119–121 on the A layer through the designation of the window 126.

In step 310, the data output section 13 reads the data of the patterns 119, 121, 122, 123, 124 and 125, and the data of the pattern 136 replacing the pattern 120 as the data of the pattern group 137 from the intermediate file 4 via the register section 14. This pattern 136 is the true result of the operation executed by the processing unit 17. The data output section 13 stores the data of the pattern group 137 in the output file 5.

In this embodiment, the data of the window frame pattern 127, produced by the data combining section 9 in accordance with the window designating information, is treated in the same way as the data of the individual patterns constituting the pattern group 118, and can be pattern data which clarifies the process area designated by the window 126. Accordingly, the ALU 10 can easily and surely extract the data of the pattern 134 lying in the window 126 (true process target area) by performing the AND operation on the combined pattern 133, resulting from the designation of the window 126, and the window frame pattern 127. That is, any pattern lying outside the window 126 is not reflected, as the operation result, on the output. This improves the reliability of the result of the pattern data processing.

Further, the data of the window frame pattern 127 allows the ALU 10 to perform the SUB operation on all of the original patterns 119–121 on the A layer and the window frame pattern 127 to easily and surely extract the data of the patterns 119, 121 and 135 lying outside the window 126 (true process target area). The data of the window frame pattern 127 provides the correlation between the pattern 134 in the true process target area and the pattern 135 lying outside the true process target area. This allows the ALU 10 to finally combine the patterns 134 and 135 and reflect the data of the pattern 134, resulting from the processing of the data of the patterns lying in the window, on the data of the original pattern group 118 easily and surely with high accuracy. The efficiency of pattern data processing is therefore improved.

The enlargement of a pattern in accordance with the zoom-up specifying width W5 by the zoom operation section 95 and the reduction of a pattern in accordance with the zoom-down specifying width W6 by this section 95 allows various characteristics of a transistor to be easily adjusted.

Although only two embodiments of the present invention have been described herein, it should be apparent to those skilled in the art that the present invention may be embodied in many other specific forms without departing from the spirit or scope of the invention. Particularly, it should be understood that this invention may be modified so that the ALU 10 executes an EOR operation on two or more pieces of pattern data in addition to the AND operation, OR operation and SUB operation. When there are overlapping portions between a plurality of patterns, the EOR operation produces data of a new single pattern representing the patterns excluding the overlapping portions.

Therefore, the present examples and embodiments are to be considered as illustrative and not restrictive and the invention is not to be limited to the details given herein, but may be modified within the scope of the appended claims.

What is claimed is:

1. A computer based method of designing a layout of circuit component patterns formed on a semiconductor integrated circuit, the method comprising the steps of:

(a) inputting circuit component pattern data, circuit pattern control data, and window designation data to the computer, the circuit component pattern data being descriptive of the layout of component patterns formed on the semiconductor integrated circuit, the circuit pattern control data being descriptive of a predetermined procedure to be performed on the circuit component patterns formed on the semiconductor integrated circuit;

(b) defining a window over the circuit component patterns based on the window designation data, thereby identifying only portions of the circuit component pattern data of the circuit component patterns that are wholly or partially within the window;

(c) generating window pattern data descriptive of a layout of the defined window, including extrapolated positions of corners of the window other than corners defined in the window designation data, by using the window designation data;

(d) processing the identified circuit component pattern data using the window pattern data according to the predetermined procedure to be performed on the circuit pattern control data to produce processed pattern data having a portion within the window and a portion outside the window; and (e) selectively identifying the portion of the processed pattern data that is within the window and excluding the portion of the processed pattern data that is outside the window using the window pattern data by performing a pattern processing using the window pattern data to be the same as the processed pattern data.

2. The method according to claim 1, wherein the predetermined procedure includes a process according to design requirements, and wherein said processing according to the predetermined procedure includes the steps of:

determining a distance separating the circuit component patterns on said semiconductor; and generating an error indication pattern between the circuit component patterns when the distance fails to meet the design requirements.

3. The method according to claim 2, wherein said selectively identifying step includes the step of identifying the processed pattern data as the error indication pattern wholly within the defined window.

4. The method according to claim 3, wherein said processing according to the predetermined procedure step further includes the step of combining at least two of the circuit component patterns overlapping each other, before said determining step.

5. The method according to claim 1,
wherein said processing according to the predetermined procedure step includes the step of designing a new circuit component pattern data by using the identified circuit component pattern data; and
wherein said selectively identifying step includes the step of determining an overlapping portion between the new circuit component pattern and the window described by the window pattern data, as a first partial pattern data.

6. The method according to claim 5, further comprising the steps of:
selecting the identified circuit component pattern data lying outside the window as a second partial pattern data; and
combining the first partial pattern data and the second partial pattern data to generate a single combined pattern data.

7. An apparatus for designing a layout of circuit component patterns formed on a semiconductor integrated circuit, the apparatus comprising:
an input file storing circuit component pattern data descriptive of the layout of the circuit component patterns formed on the semiconductor integrated circuit; and
a processing unit coupled to said input file and supplied with circuit pattern control data and window designation data, the circuit pattern control data being descriptive of predetermined procedure to be performed on the circuit component patterns formed on the semiconductor integrated circuit, wherein said processing unit:
(a) inputs the circuit component pattern data from said input file;
(b) defines a window over the circuit component patterns based on the window designation data, thereby identifying only portions of circuit component pattern data of the circuit component patterns that are wholly or partially within the window;
(c) generates window pattern data descriptive of a layout of the defined window, including extrapolated positions of corners of the window other than corners defined in the window designation data, by using the window designation data;
(d) processes the identified circuit component pattern data using the window pattern data according to the predetermined procedure to be performed on the circuit pattern control data to produce processed pattern data having a portion within the window and a portion outside the window; and
(e) selectively identifies the portion of the processed pattern data that is within the window and excludes the portion of the processed pattern data that is outside the window using the window pattern data by performing a pattern processing using the window pattern data to be the same as the processed pattern data.

8. The apparatus according to claim 7 further comprising an intermediate file serving as work memory and temporarily storing said identified circuit component pattern data the window pattern data.

9. The apparatus according to claim 7, wherein the predetermined procedure includes a process according to design requirements, and wherein said processing unit determines a distance separating the circuit component patterns, and generates an error indication pattern between the circuit component patterns when the distance fails to meet the design requirements.

10. The apparatus according to claim 9, wherein said processing unit selectively identifies the processed pattern data as the error indication pattern wholly within the defined window.

11. The apparatus according to claim 10, wherein said processing unit combines at least two overlapping ones of the circuit component patterns, before said determination of the distance therebetween.

12. The apparatus according to claim 7, wherein said processing unit designs a new circuit component pattern using the identified circuit component pattern data and determines an overlapping portion between said new circuit component pattern and the defined window as a first partial pattern data.

13. The apparatus according to claim 12, wherein said processing unit selects the identified circuit component pattern data lying outside said window as a second partial pattern data and combines said first partial pattern data and said second partial pattern data to generate a single combined pattern data.

14. The apparatus according to claim 12, wherein said processing unit includes a zoom operation section for enlarging or reducing the identified circuit component pattern.

15. A computer based method of designing a layout of circuit component patterns on a semiconductor integrated circuit, said method comprising:
inputting circuit component pattern data describing the layout of the circuit component patterns and circuit pattern control data describing design requirements applicable to the circuit component patterns;
designating a window over a portion of the circuit component patterns;
generating window pattern data descriptive of a layout of the window, including extrapolated positions of corners of the window other than corners defined in said step of designating;
applying the circuit pattern control data on the portion of the circuit component patterns identified wholly or partially within the window to produce processed pattern data having a portion within the window and a portion outside the window; and
selectively identifying the portion of the processed pattern data within the window and excluding the portion of the processed pattern data that is outside the window by performing a pattern processing using the window pattern data to be the same as the processed pattern data.

16. An apparatus for designing a layout of circuit component patterns on a semiconductor integrated circuit, said apparatus comprising:
a storage device storing input circuit component pattern data describing the layout of the circuit component patterns and circuit pattern control data describing design requirements applicable to tile circuit component patterns;

a control device designating a window over a portion of the circuit component patterns and generating window pattern data descriptive of a layout of the window, including extrapolated positions of corners of the window other than corners defined when designating the window; and a processing unit applying the circuit pattern control data on the portion of the circuit component patterns identified wholly or partially within the window to produce processed pattern data having a portion within the window and a portion outside the window, and selectively identifying the portion of the processed pattern data within the window and excluding the portion of the processed pattern data that is outside the window by performing a pattern processing using the window pattern data to be the same as the processed pattern data.

17. A computer based method of designing a layout of circuit component patterns formed on a semiconductor integrated circuit, the method comprising the steps of:

(a) inputting circuit component pattern data, circuit pattern control data, and window designation data to the computer, the circuit component pattern data being descriptive of the layout of component patterns formed on the semiconductor integrated circuit, the circuit pattern control data being descriptive of a predetermined procedure to be performed on the circuit component patterns formed on the semiconductor integrated circuit;

(b) defining a window over the circuit component patterns based on the window designation data, thereby identifying only portions of the circuit component pattern data of the circuit component patterns that are wholly or partially within the window;

(c) generating window pattern data descriptive of a layout of the defined window by using the window designation data;

(d) processing the identified circuit component pattern data using the window pattern data according to the predetermined procedure to be performed on the circuit pattern control data to produce processed pattern data including a first processed pattern data within the window and a second processed pattern data outside the window; and (e) selectively identifying the first processed pattern data that is within the window and excludes the second processed pattern data that is outside the window using the window pattern data by performing a pattern processing using the window pattern data to be the same as the processed pattern data.

18. An apparatus for designing a layout of circuit component patterns formed on a semiconductor integrated circuit, the apparatus comprising:

an input file storing circuit component pattern data descriptive of the layout of the circuit component patterns formed on the semiconductor integrated circuit; and a processing unit coupled to said input file and supplied with circuit pattern control data and window designation data, the circuit pattern control data being descriptive of predetermined procedure to be performed on the circuit component patterns formed on the semiconductor integrated circuit, wherein said processing unit:

(a) inputs the circuit component pattern data from said input file;

(b) defines a window over the circuit component patterns based on the window designation data, thereby identifying only portions of circuit component pattern data of the circuit component patterns that are wholly or partially within the window;

(c) generates window pattern data descriptive of a layout of the defined window by using the window designation data;

(d) processes the identified circuit component pattern data using the window pattern data according to the predetermined procedure to be performed on the circuit pattern control data to produce processed pattern data including a first processed pattern data within the window and a second processed pattern data outside the window; and (e) selectively identifies the first processed pattern data that is within the window and excludes the second processed pattern data that is outside the window using the window pattern data by performing a pattern processing using the window pattern data to be the same as the processed pattern data.

19. A computer based method of designing a layout of circuit component patterns on a semiconductor integrated circuit, said method comprising:

inputting circuit component pattern data describing the layout of the circuit component patterns and circuit pattern control data describing design requirements applicable to the circuit component patterns;

designating a window over a portion of the circuit component patterns;

generating window pattern data descriptive of a layout of the window;

applying the circuit pattern control data on the portion of the circuit component patterns identified wholly or partially within the window to produce processed pattern data including a first processed pattern data within the window and a second processed pattern data outside the window; and selectively identifying the first processed pattern data within the window and excluding the second processed pattern data that is outside the window by performing a pattern processing using the window pattern data to be the same as the processed pattern data.

20. An apparatus for designing a layout of circuit component patterns on a semiconductor integrated circuit, said apparatus comprising:

a storage device storing input circuit component pattern data describing the layout of the circuit component patterns and circuit pattern control data describing design requirements applicable to the circuit component patterns;

a control device designating a window over a portion of the circuit component patterns and generating window pattern data descriptive of a layout of the window; and a processing unit applying the circuit pattern control data on the portion of the circuit component patterns identified wholly or partially within the window to produce processed pattern data including a first processed pattern data within the window and a second processed pattern data outside the window, and selectively identifying the first processed pattern data within the window and excluding the second processed pattern data that is outside the window by performing a pattern processing using the window pattern data to be the same as the processed pattern data.

* * * * *

UNITED STATES PATENT AND TRADEMARK OFFICE
CERTIFICATE OF CORRECTION

PATENT NO. : 5,946,476
DATED : August 31, 1999
INVENTOR(S) : Junji TOMIDA

It is certified that error appears in the above-identified patent and that said Letters Patent is hereby corrected as shown below:

On the title page in item [73], change the Inventor, "Junji Tomoda" to be --Junji Tomida--.

Signed and Sealed this

Thirteenth Day of June, 2000

Attest:

Q. TODD DICKINSON

*Attesting Officer*          *Director of Patents and Trademarks*